United States Patent
Teraguchi

(10) Patent No.: US 12,316,306 B2
(45) Date of Patent: May 27, 2025

(54) HIGH FREQUENCY SEMICONDUCTOR INTEGRATED CIRCUIT

(71) Applicants: Kabushiki Kaisha Toshiba, Tokyo (JP); Toshiba Electronic Devices & Storage Corporation, Tokyo (JP)

(72) Inventor: Takayuki Teraguchi, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 116 days.

(21) Appl. No.: 18/243,635

(22) Filed: Sep. 7, 2023

(65) Prior Publication Data
US 2024/0322808 A1   Sep. 26, 2024

(30) Foreign Application Priority Data
Mar. 22, 2023  (JP) .................... 2023-045829

(51) Int. Cl.
*H03K 17/0412*  (2006.01)
*H03K 17/16*  (2006.01)
*H03K 17/693*  (2006.01)

(52) U.S. Cl.
CPC ..... *H03K 17/04123* (2013.01); *H03K 17/162* (2013.01); *H03K 17/693* (2013.01)

(58) Field of Classification Search
None
See application file for complete search history.

(56) References Cited

U.S. PATENT DOCUMENTS

| | | | | |
|---|---|---|---|---|
| 5,914,544 | A * | 6/1999 | Tanaka | H04B 1/48 455/199.1 |
| 6,987,414 | B2 * | 1/2006 | Numata | H01P 1/15 327/365 |
| 7,345,521 | B2 * | 3/2008 | Takahashi | H04B 1/48 333/81 R |
| 7,633,357 | B2 * | 12/2009 | Hangai | H01P 1/15 333/262 |
| 9,397,656 | B2 * | 7/2016 | Dribinsky | H03K 17/284 |
| 10,256,775 | B2 | 4/2019 | Seshita et al. | |
| 10,629,972 | B2 * | 4/2020 | Kuo | H04B 1/005 |
| 11,206,017 | B2 * | 12/2021 | Burgener | H04B 1/40 |

(Continued)

FOREIGN PATENT DOCUMENTS

| | | |
|---|---|---|
| JP | 2013-048390 A | 3/2013 |
| JP | 2015-523810 A | 8/2016 |
| JP | 2018-201069 A | 12/2018 |

*Primary Examiner* — Cassandra F Cox
(74) *Attorney, Agent, or Firm* — Kim & Stewart LLP

(57) ABSTRACT

According to one embodiment, a high frequency semiconductor integrated circuit includes a first input terminal, a second input terminal, a first output terminal, a second output terminal, first to fourth switch circuits. In a case where a coupling destination of the first input terminal is switched from the first output terminal to the second output terminal, a third switching operation changing the third switch circuit from an ON state to an OFF state and a fourth switching operation changing the fourth switch circuit from the OFF state to the ON state are finished, after a first switching operation changing the first switch circuit from the ON state to the OFF state and a second switching operation changing the second switch circuit from the OFF state to the ON state are finished.

19 Claims, 18 Drawing Sheets

(56) References Cited

U.S. PATENT DOCUMENTS

| | | | |
|---|---|---|---|
| 11,469,758 B2 * | 10/2022 | Sakakida | H03K 17/04123 |
| 12,074,217 B2 * | 8/2024 | Brindle | H10D 62/378 |
| 2014/0009209 A1 | 1/2014 | Cebi et al. | |
| 2022/0045679 A1 * | 2/2022 | Noh | H03K 17/6874 |

* cited by examiner

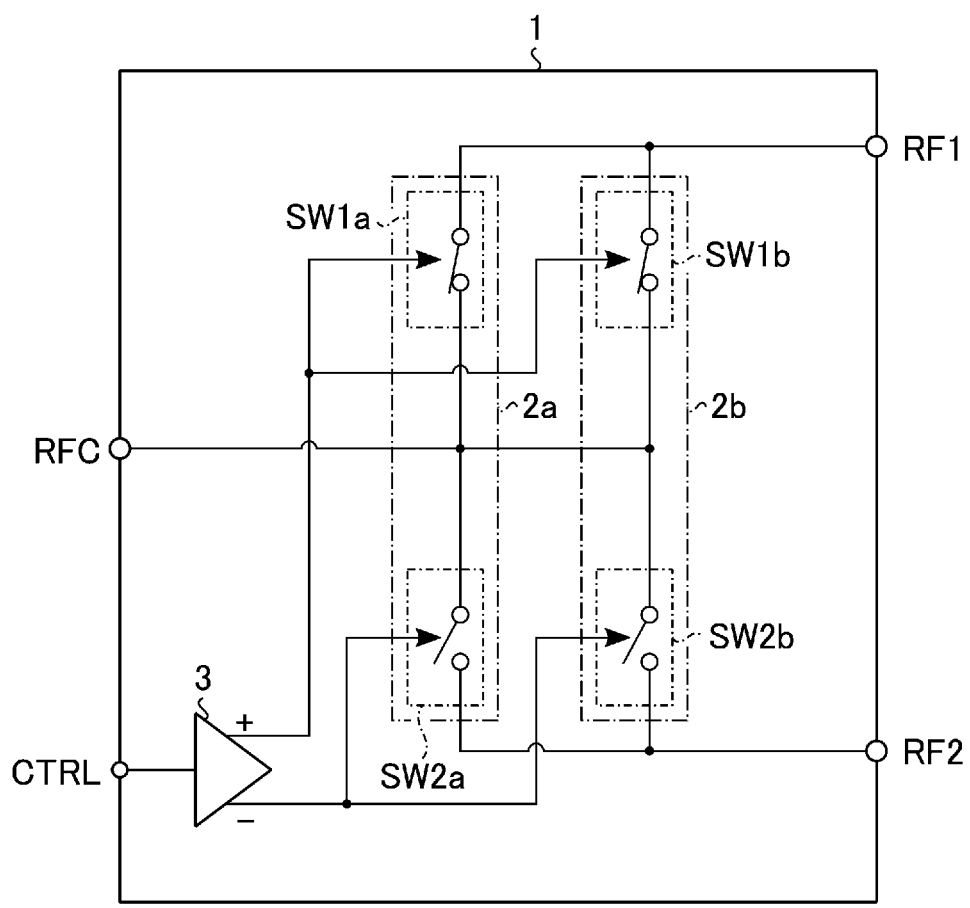
F I G. 1

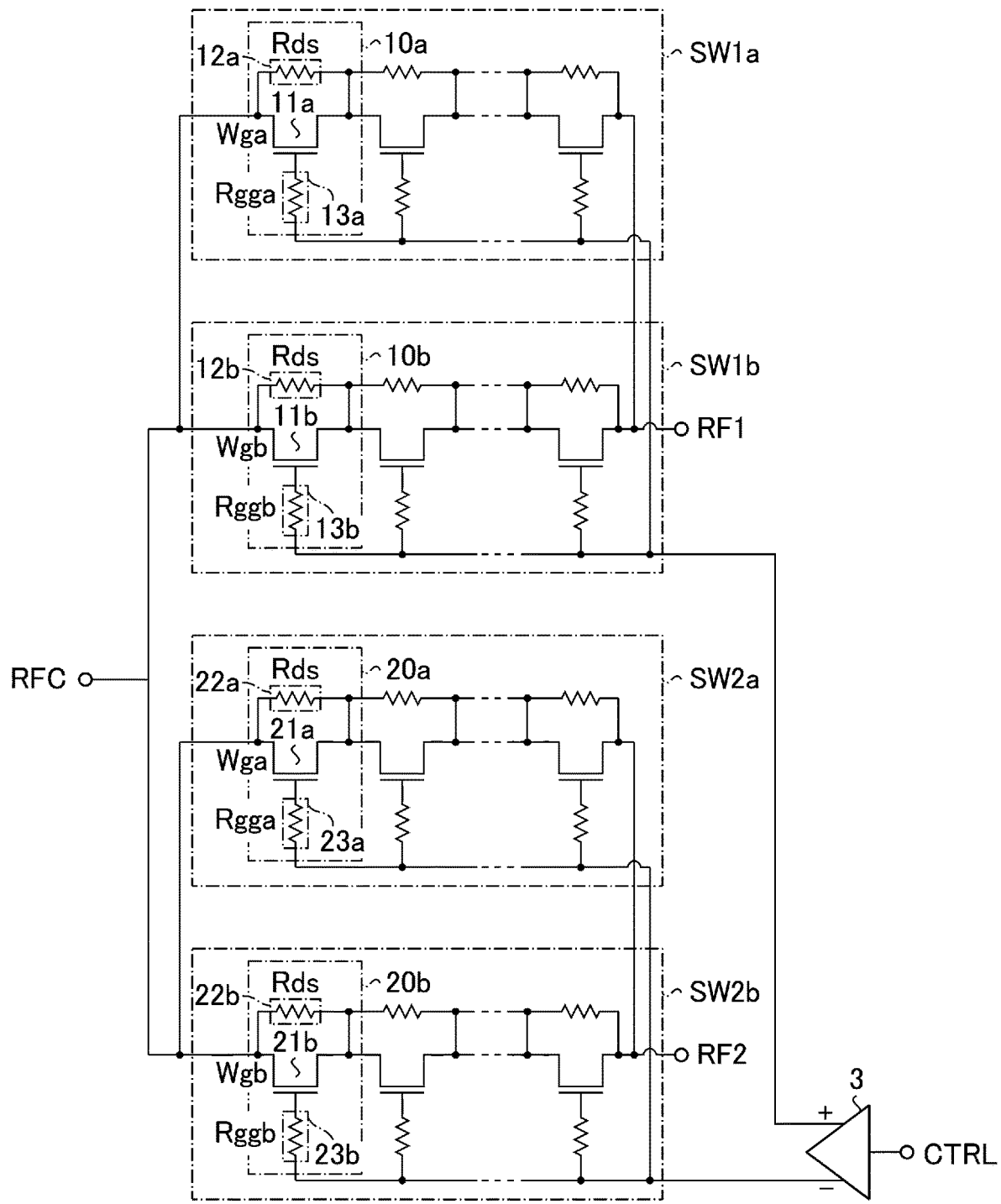
F I G. 2

| Step | SW1a | SW1b | SW2a | SW2b | RFC impedance (Ω) |
|---|---|---|---|---|---|
| 0 | On | On | Off | Off | 55 |
| 1 | Off | On | On | Off | 30 |
| 2 | Off | Off | On | On | 55 |

FIG. 4

| Step | SW1a | SW1b | SW2a | SW2b | RFC impedance (Ω) |
|---|---|---|---|---|---|
| 0 | On | On | Off | Off | 55 |
| 0.5 | On | On | On | Off | 29 |
| 1 | Off | On | On | Off | 30 |
| 1.5 | Off | On | On | On | 29 |
| 2 | Off | Off | On | On | 55 |

FIG. 5

| Step | SW1a | SW1b | SW2a | SW2b | RFC impedance (Ω) |
|---|---|---|---|---|---|
| 0 | On | On | Off | Off | 55 |
| 0.5 | Off | On | Off | Off | 60 |
| 1 | Off | On | On | Off | 30 |
| 1.5 | Off | Off | On | Off | 60 |
| 2 | Off | Off | On | On | 55 |

FIG. 6

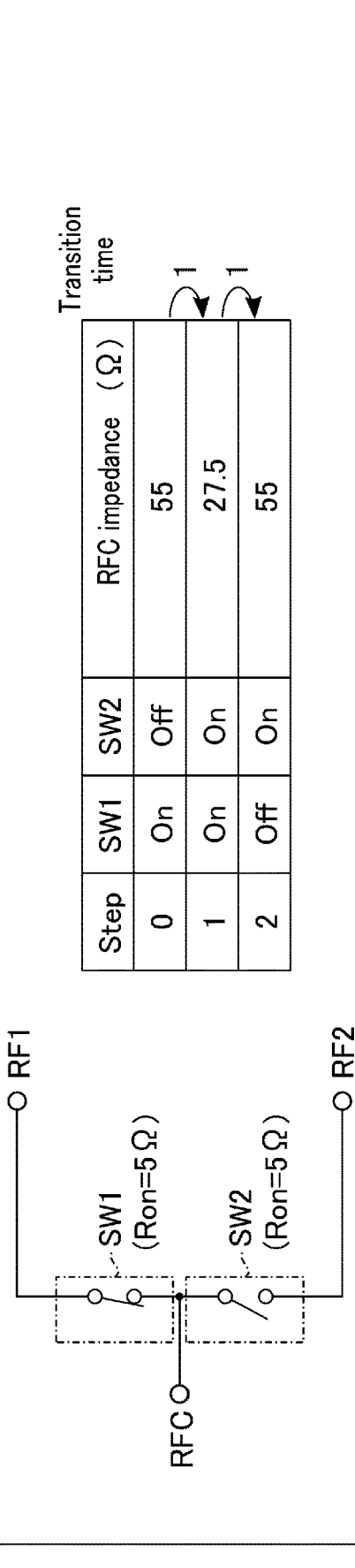
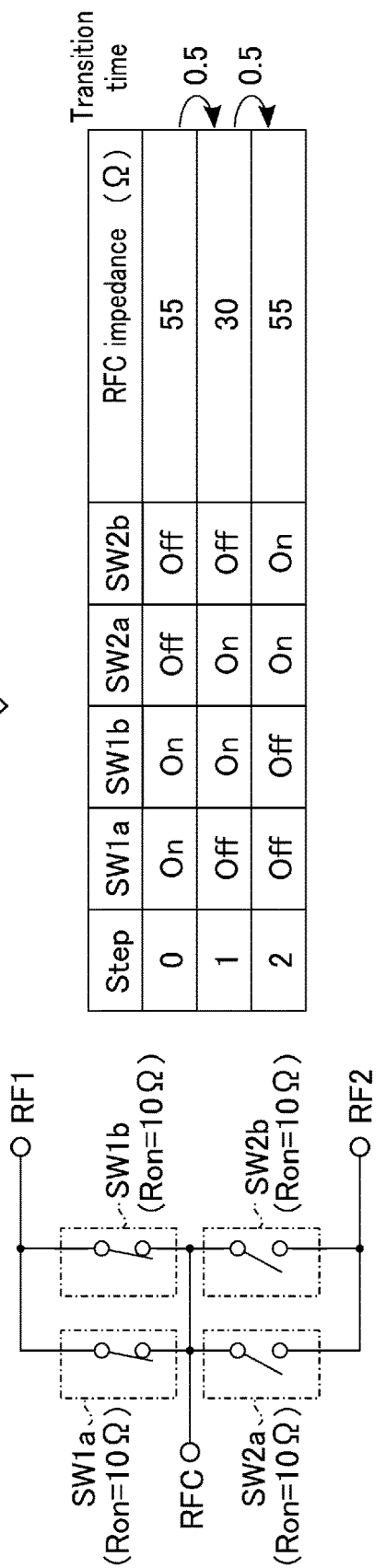
FIG. 7

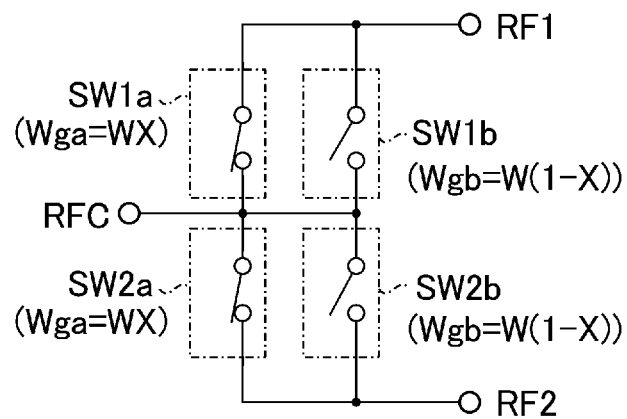
F I G. 8
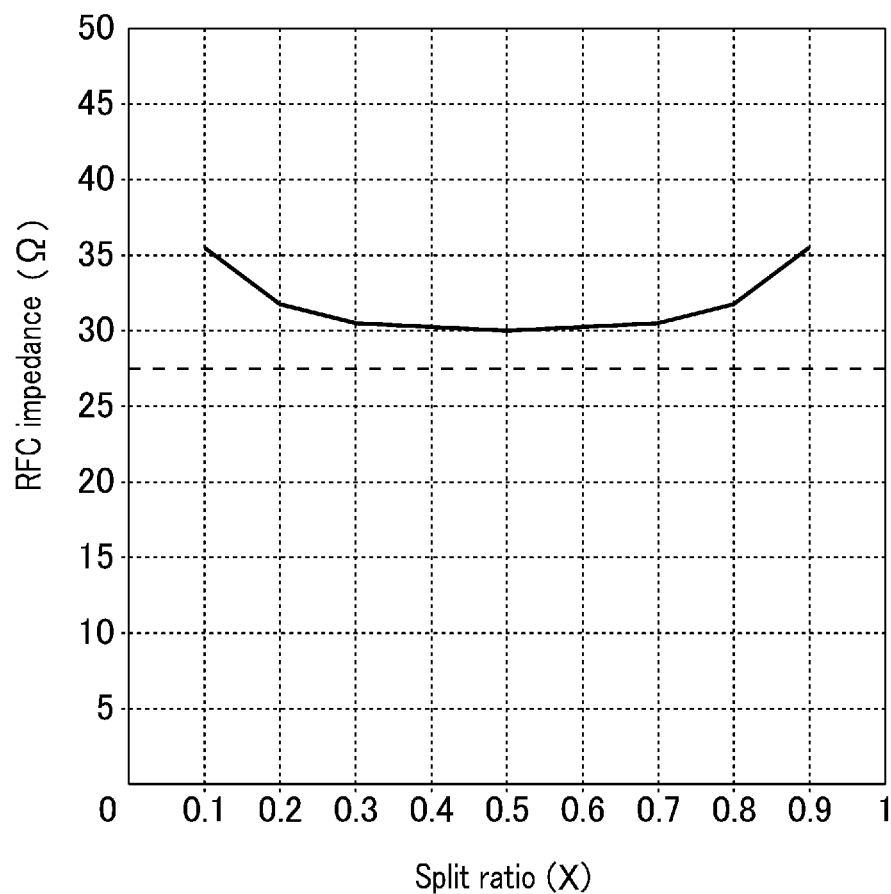
F I G. 9

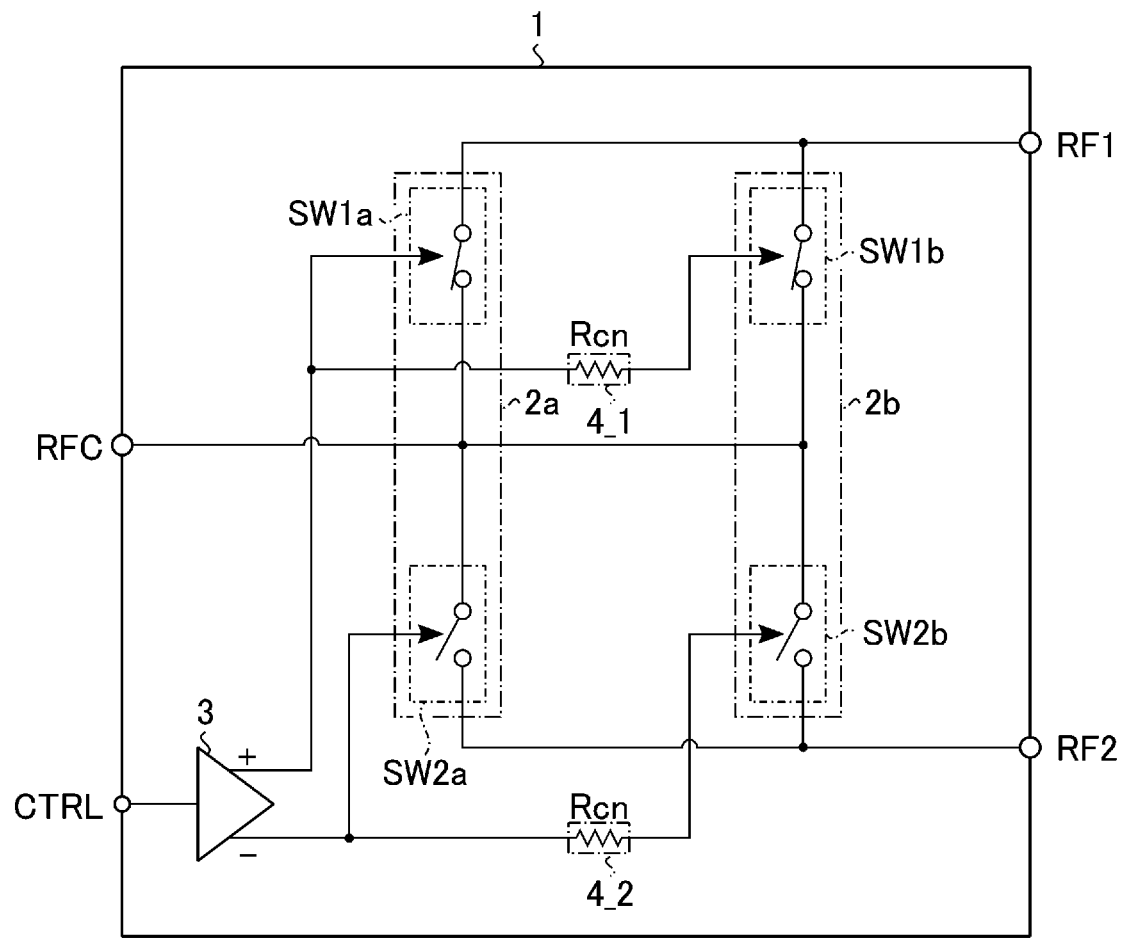
F I G. 10

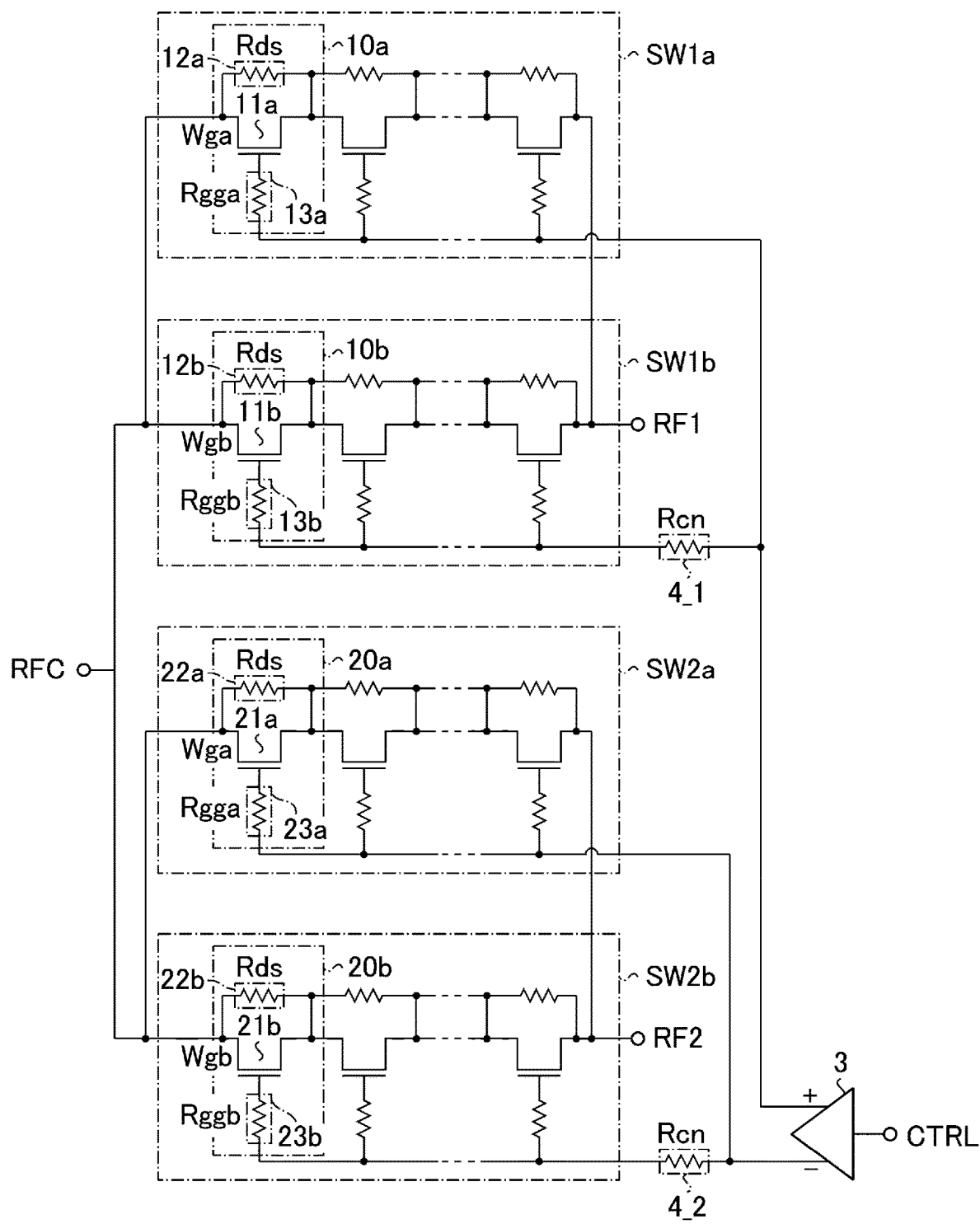
F I G. 11

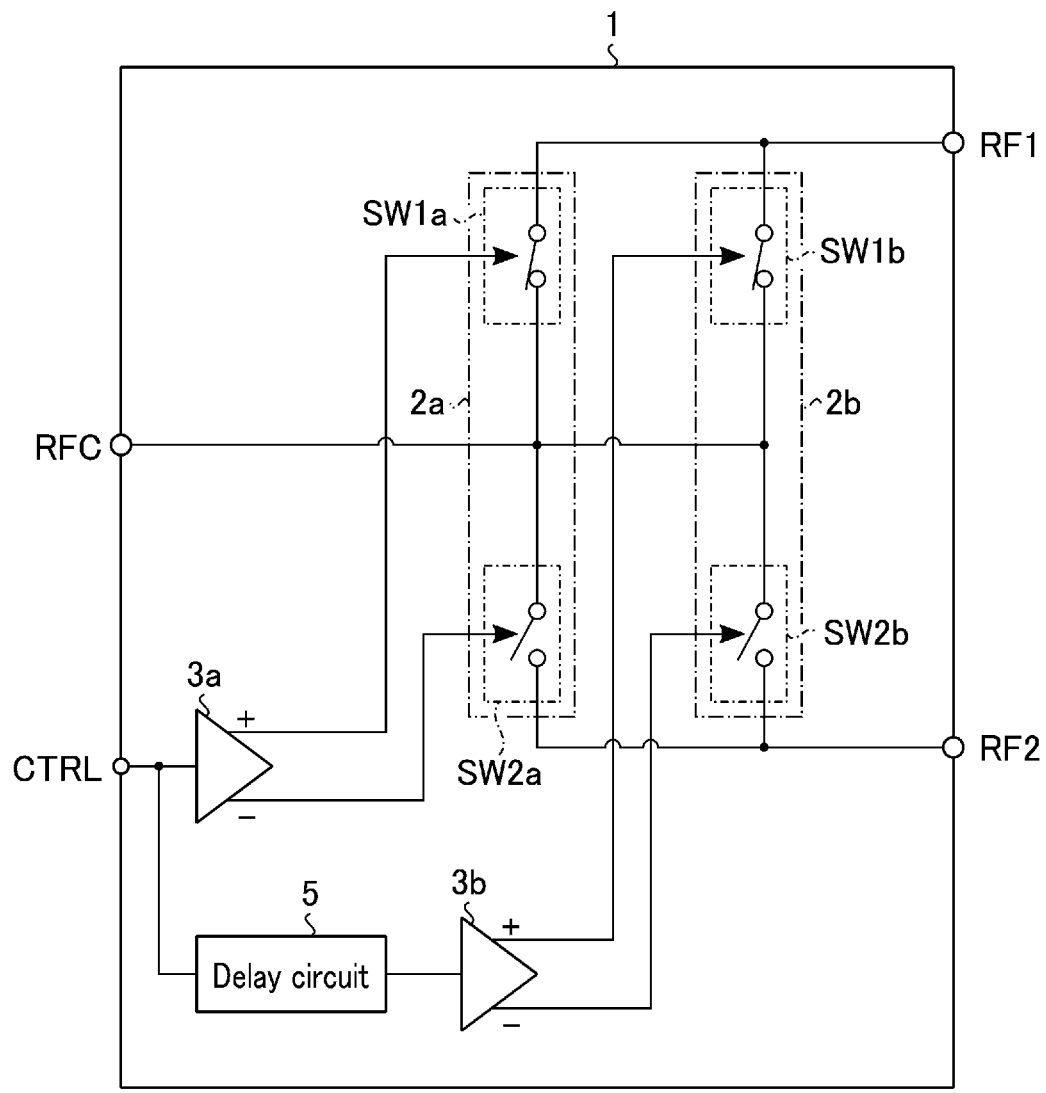
F I G. 12

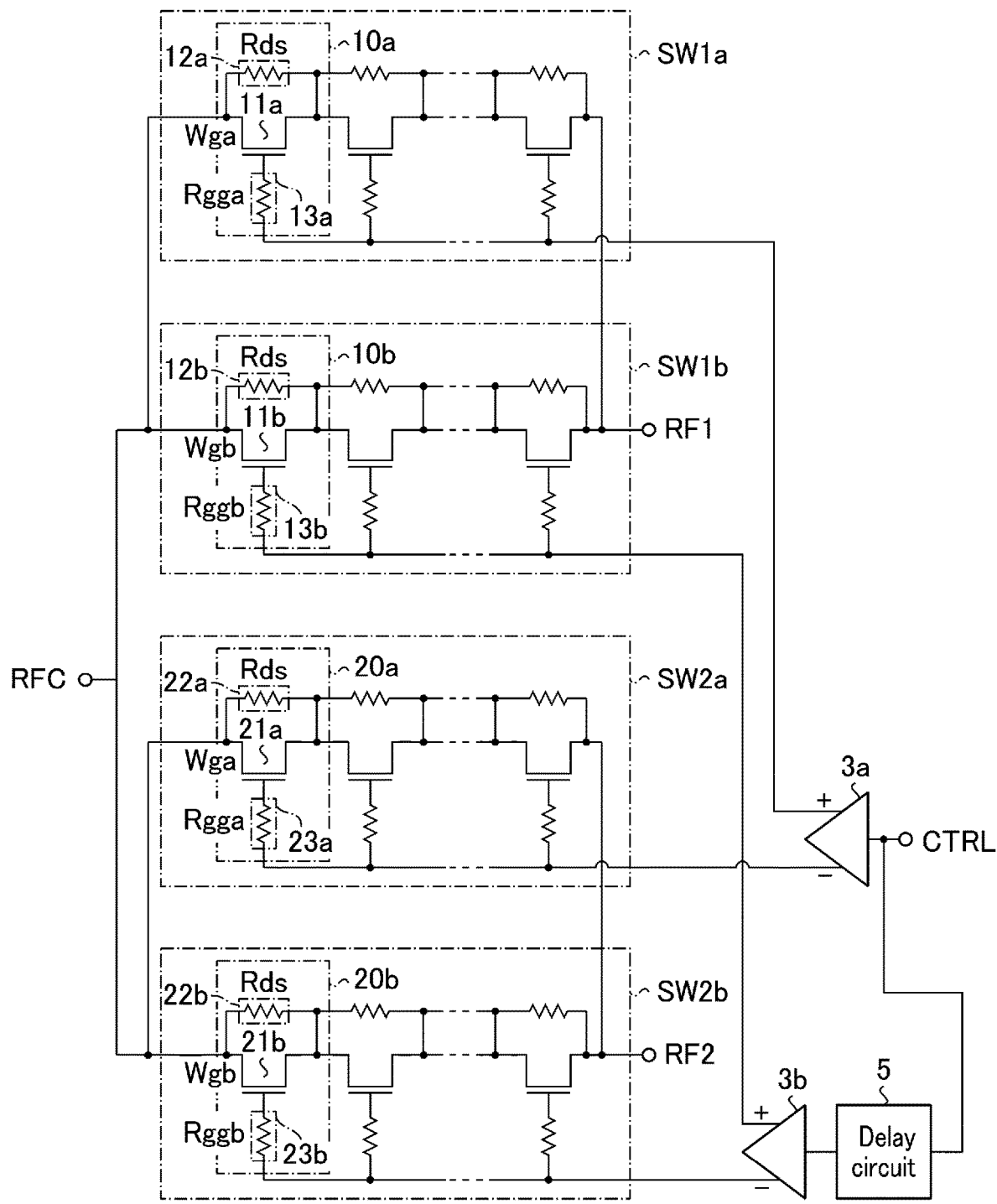
F I G. 13

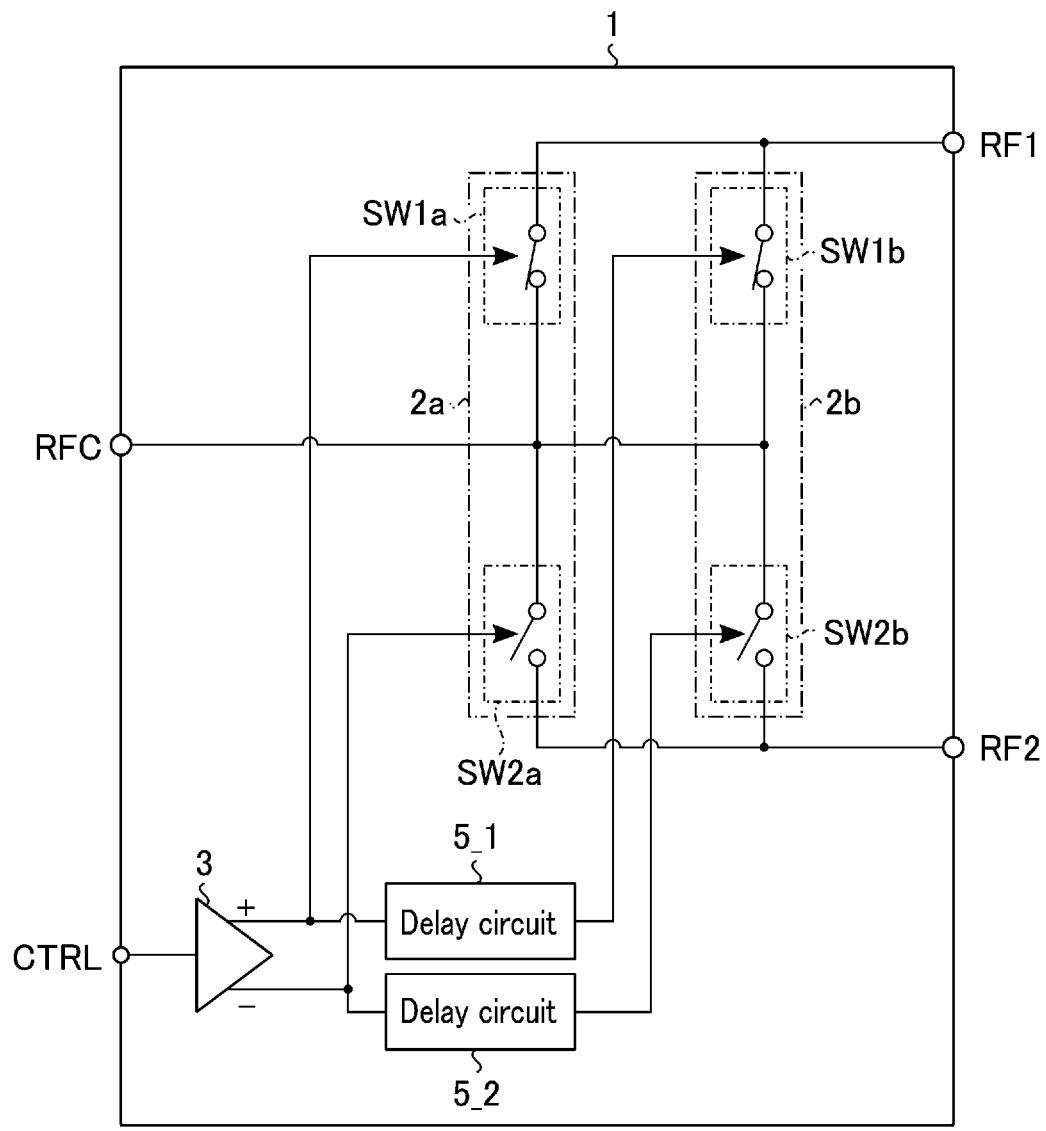
F I G. 15

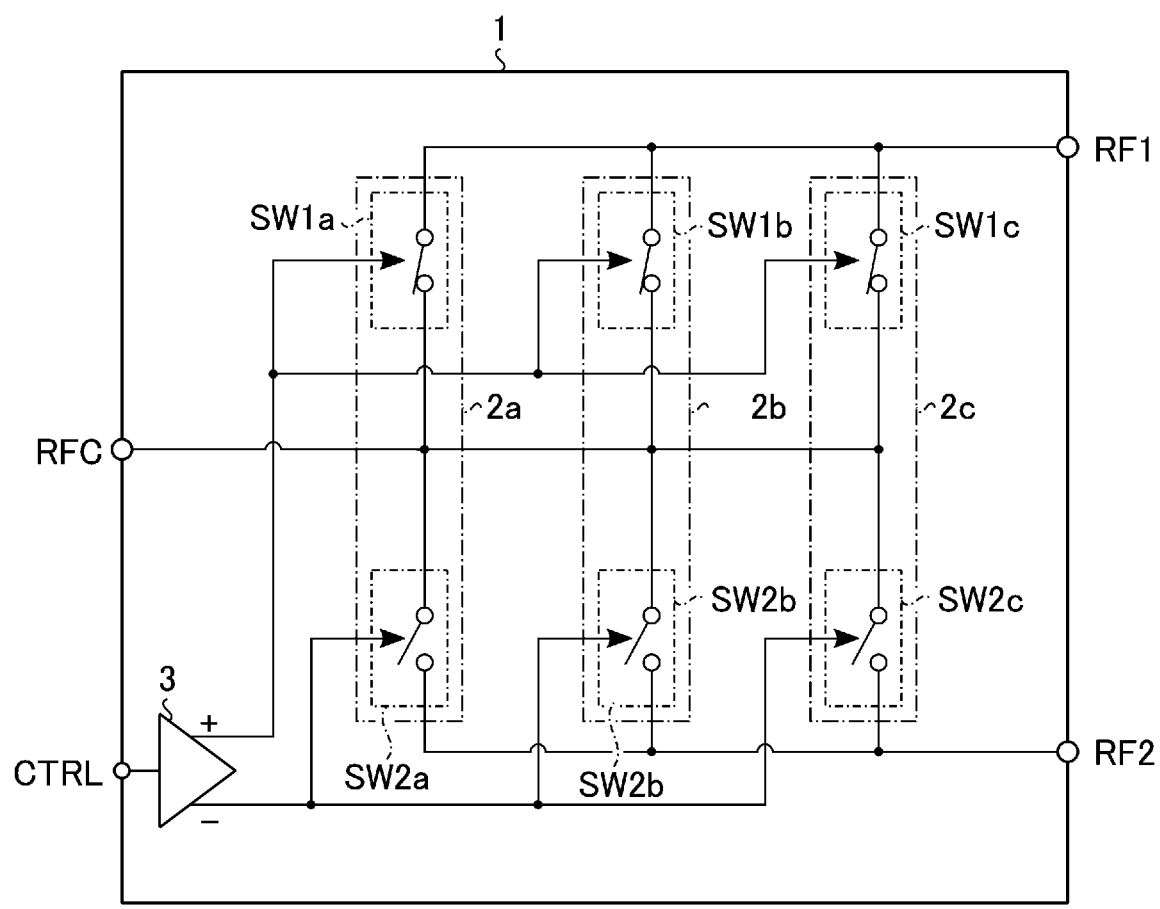
F I G. 16

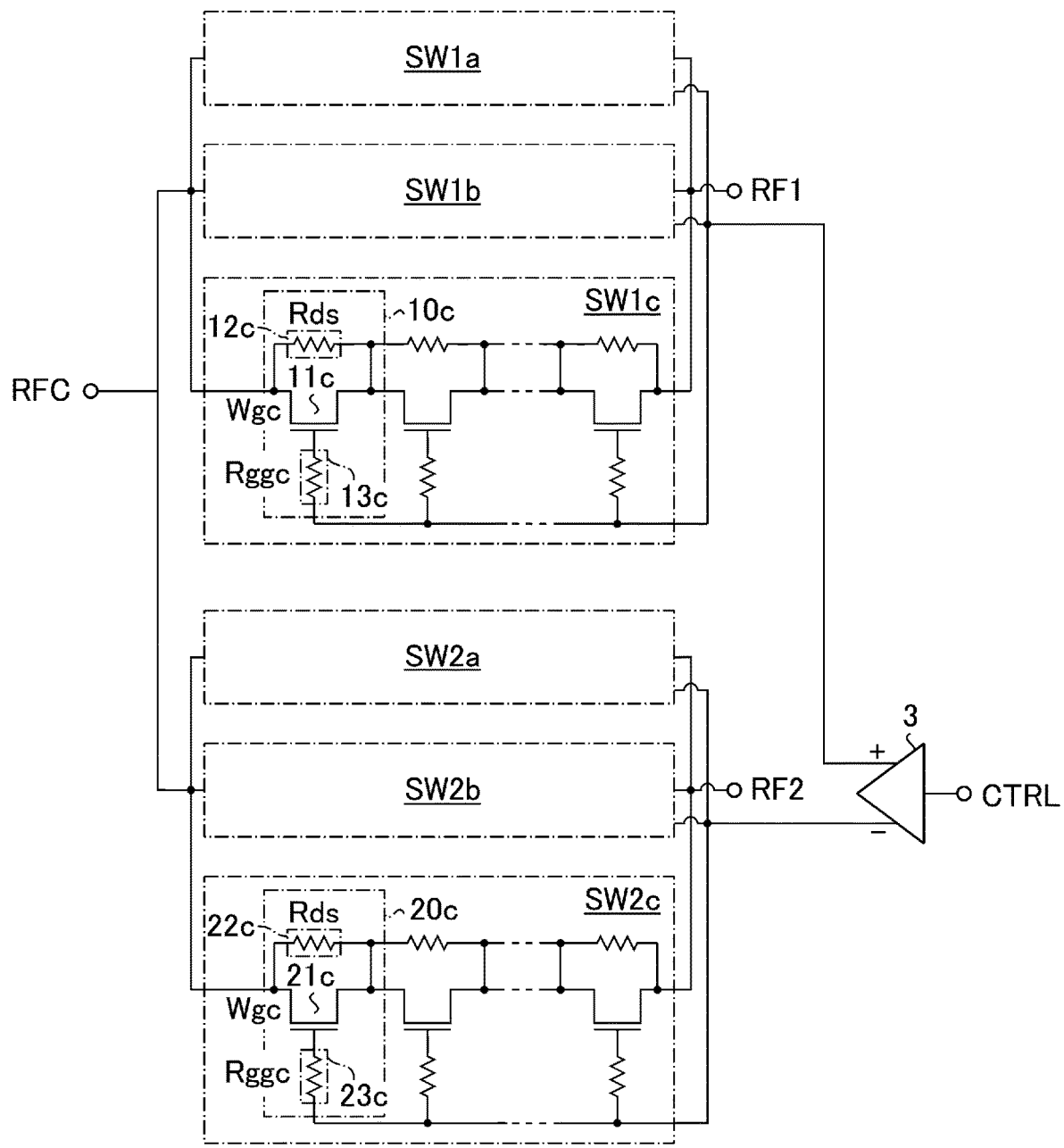
F I G. 17

| Step | SW1a | SW1b | SW1c | SW2a | SW2b | SW2c | RFC impedance | Transition time |
|---|---|---|---|---|---|---|---|---|
| 0 | On | On | On | Off | Off | Off | 55 (Ω) | |
| 1 | Off | On | On | On | Off | Off | 30.5 | 0.33 |
| 2 | Off | Off | On | On | On | Off | 30.5 | 0.33 |
| 3 | Off | Off | Off | On | On | On | 55 | 0.33 |

F I G. 18

| Step | SW1a | SW1b | SW1c | SW2a | SW2b | SW2c | RFC impedance |
|---|---|---|---|---|---|---|---|
| 0 | On | On | On | Off | Off | Off | 55 (Ω) |
| 0.5 | On | On | On | On | Off | Off | 30 |
| 1 | Off | On | On | On | Off | Off | 30.5 |
| 1.5 | Off | On | On | On | On | Off | 29 |
| 2 | Off | Off | On | On | On | Off | 30.5 |
| 2.5 | Off | Off | On | On | On | On | 30 |
| 3 | Off | Off | Off | On | On | On | 55 |

F I G. 19

| Step | SW1a | SW1b | SW1c | SW2a | SW2b | SW2c | RFC impedance |
|---|---|---|---|---|---|---|---|
| 0 | On | On | On | Off | Off | Off | 55 (Ω) |
| 0.5 | Off | On | On | Off | Off | Off | 57.5 |
| 1 | Off | On | On | On | Off | Off | 30.5 |
| 1.5 | Off | Off | On | On | Off | Off | 32.5 |
| 2 | Off | Off | On | On | On | Off | 30.5 |
| 2.5 | Off | Off | Off | On | On | Off | 57.5 |
| 3 | Off | Off | Off | On | On | On | 55 |

F I G. 20

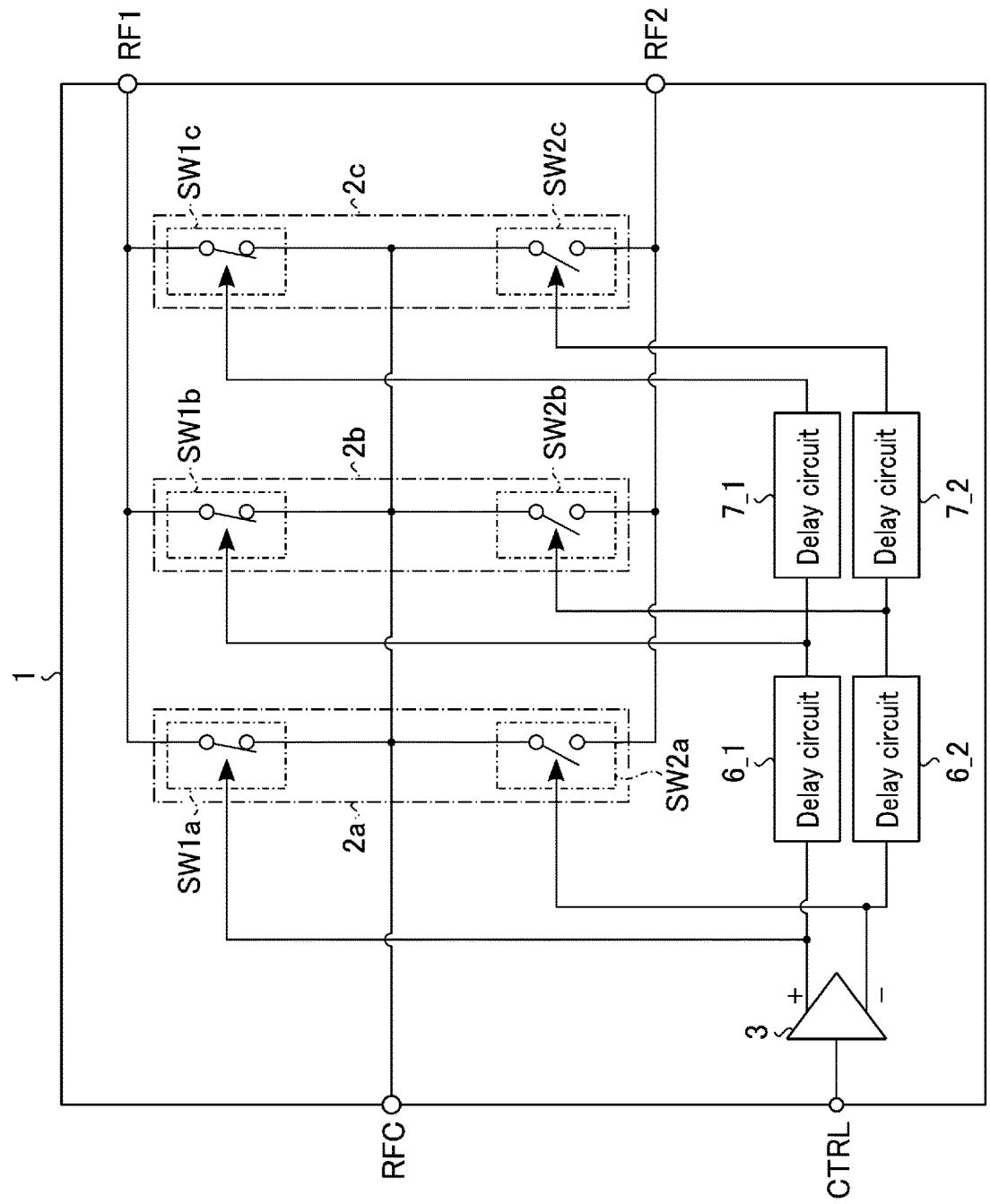
F I G. 21

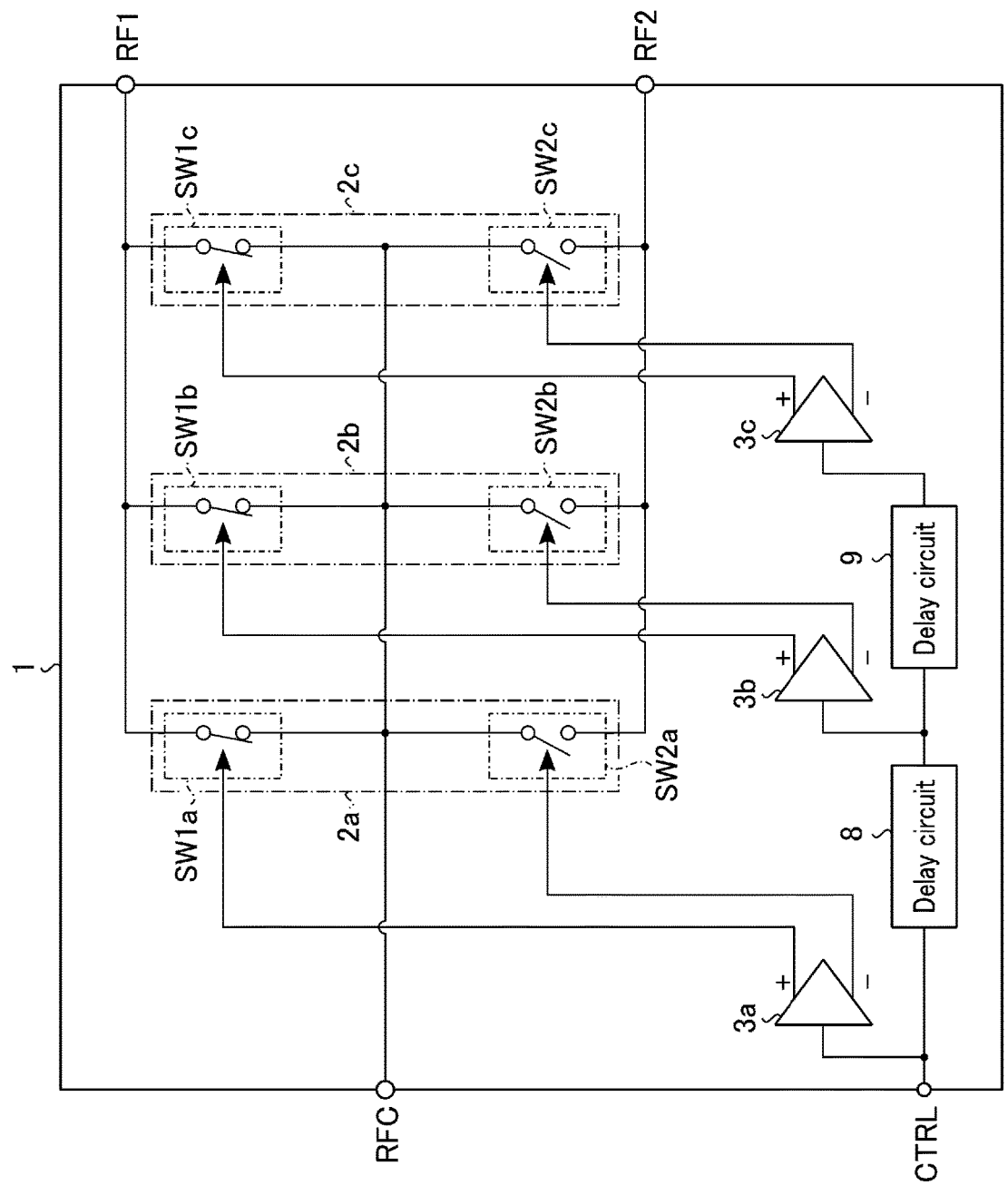
F I G. 22

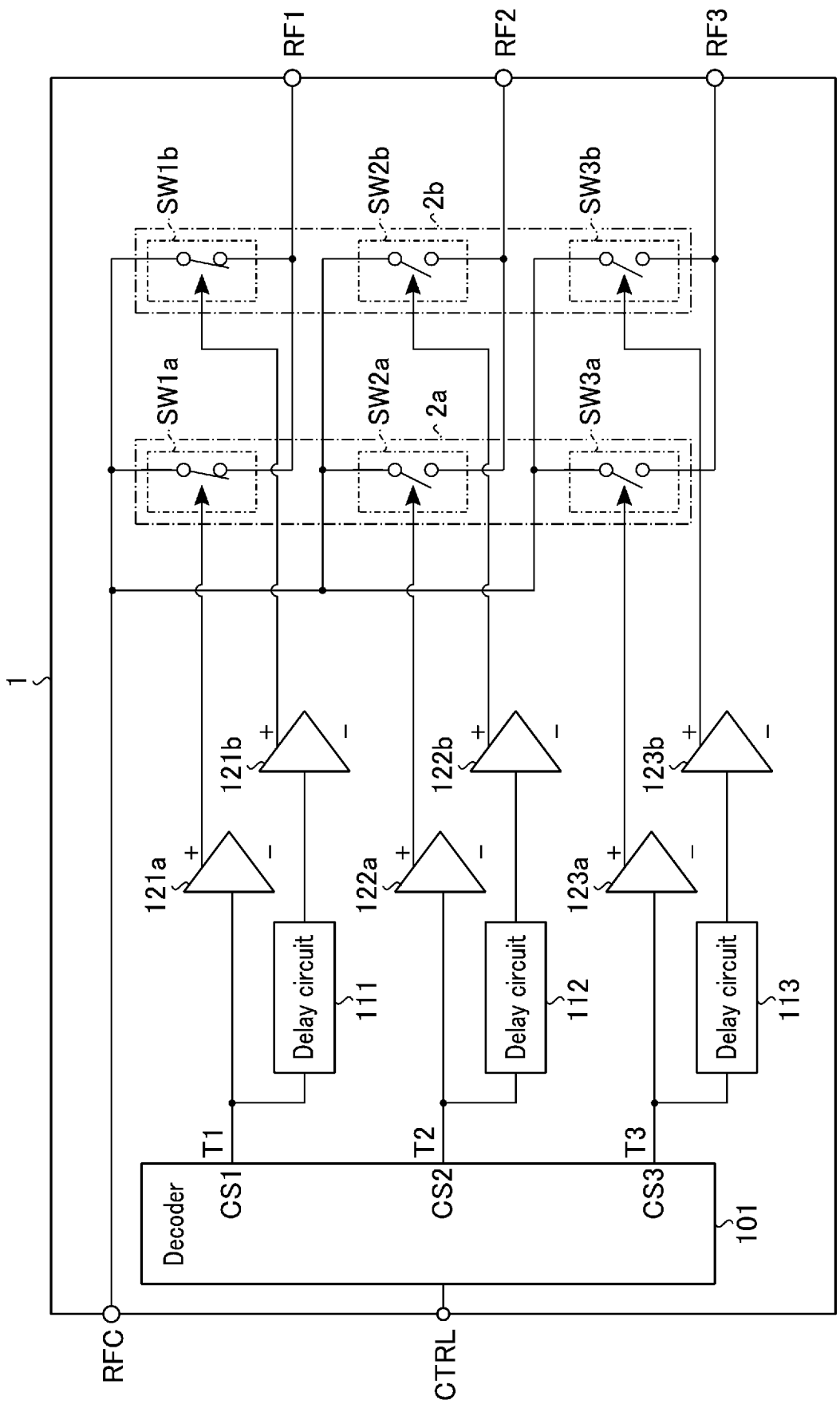
F I G. 23

HIGH FREQUENCY SEMICONDUCTOR INTEGRATED CIRCUIT

CROSS-REFERENCE TO RELATED APPLICATION

This application is based upon and claims the benefit of priority from prior Japanese Patent Application No. 2023-045829, filed Mar. 22, 2023, the entire contents of which are incorporated herein by reference.

FIELD

Embodiments described herein relate generally to a high frequency semiconductor integrated circuit.

BACKGROUND

A semiconductor switch circuit corresponding to high frequency signals is known as one of high frequency semiconductor integrated circuits.

BRIEF DESCRIPTION OF THE DRAWINGS

FIG. 1 is a block diagram illustrating an example of a whole configuration of a high frequency semiconductor integrated circuit according to a first embodiment.

FIG. 2 is a diagram illustrating an example of a circuit configuration of each of switch circuits SW1a, SW1b, SW2a, and SW2b included in the high frequency semiconductor integrated circuit according to the first embodiment.

FIG. 4 is a diagram illustrating a switching order in a case where length of rise time is equal to length of fall time in switching operations of the high frequency semiconductor integrated circuit according to the first embodiment.

FIG. 5 is a diagram illustrating a switching order in a case where the length of the rise time is shorter than the length of the fall time in the switching operations of the high frequency semiconductor integrated circuit according to the first embodiment.

FIG. 6 is a diagram illustrating a switching order in a case where the length of the rise time is longer than the length of the fall time in the switching operations of the high frequency semiconductor integrated circuit according to the first embodiment.

FIG. 7 is a diagram illustrating an example of relation between the number of parallels of the SPDT switches and the order of switching operations.

FIG. 8 is a schematic diagram illustrating relation between gate widths Wga and Wgb in a high frequency semiconductor integrated circuit according to a modification of the first embodiment.

FIG. 9 is a graph illustrating relation between a split ratio of the gate widths Wga and Wgb and RFC impedance in a case where the switch circuits SW1a and SW2a are in an ON state in the high frequency semiconductor integrated circuit according to the modification of the first embodiment.

FIG. 10 is a block diagram illustrating an example of a whole configuration of a high frequency semiconductor integrated circuit according to a second embodiment.

FIG. 11 is a diagram illustrating an example of a circuit configuration of each of switch circuits SW1a, SW1b, SW2a, and SW2b included in the high frequency semiconductor integrated circuit according to the second embodiment.

FIG. 12 is a block diagram illustrating an example of a whole configuration of a high frequency semiconductor integrated circuit according to a third embodiment.

FIG. 13 is a diagram illustrating an example of a circuit configuration of each of switch circuits SW1a, SW1b, SW2a, and SW2b included in the high frequency semiconductor integrated circuit according to the third embodiment.

FIG. 15 is a block diagram illustrating an example of a whole configuration of a high frequency semiconductor integrated circuit according to a fourth embodiment.

FIG. 16 is a block diagram illustrating an example of a whole configuration of a high frequency semiconductor integrated circuit according to a fifth embodiment.

FIG. 17 is a diagram illustrating an example of a circuit configuration of each of switch circuits SW1a, SW1b, SW1c, SW2a, SW2b, and SW2C included in the high frequency semiconductor integrated circuit according to the fifth embodiment.

FIG. 18 is a diagram illustrating a switching order in a case where length of rise time is equal to length of fall time in switching operations of the high frequency semiconductor integrated circuit according to the fifth embodiment.

FIG. 19 is a diagram illustrating a switching order in a case where the length of the rise time is shorter than the length of the fall time in the switching operations of the high frequency semiconductor integrated circuit according to the fifth embodiment.

FIG. 20 is a diagram illustrating a switching order in a case where the length of the rise time is longer than the length of the fall time in the switching operations of the high frequency semiconductor integrated circuit according to the fifth embodiment.

FIG. 21 is a block diagram illustrating an example of a whole configuration of a high frequency semiconductor integrated circuit according to a sixth embodiment.

FIG. 22 is a block diagram illustrating an example of a whole configuration of a high frequency semiconductor integrated circuit according to a seventh embodiment.

FIG. 23 is a block diagram illustrating an example of a whole configuration of a high frequency semiconductor integrated circuit according to an eighth embodiment.

DETAILED DESCRIPTION

Figure 3:
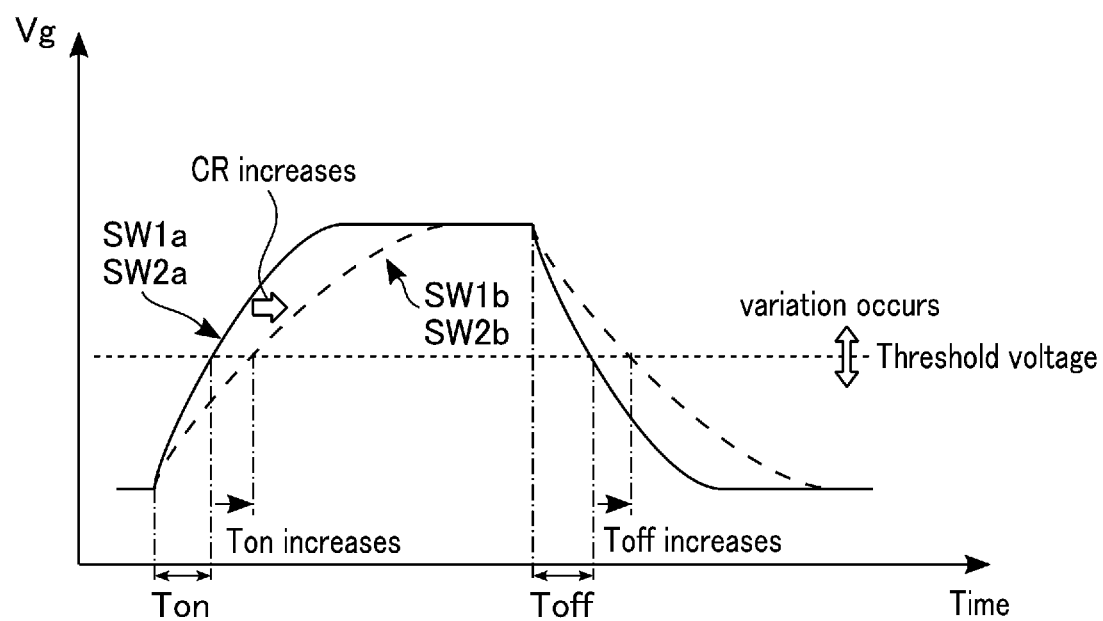
FIG. 3 is a graph illustrating switching operations of the switch circuits included in the high frequency semiconductor integrated circuit according to the first embodiment.

In general, according to one embodiment, a high frequency semiconductor integrated circuit includes: a first input terminal receiving a high frequency signal; a second input terminal receiving a control signal; a first output terminal outputting the high frequency signal; a second output terminal outputting the high frequency signal; a first switch circuit controlling electrical coupling between the first input terminal and the first output terminal; a second switch circuit controlling electrical coupling between the first input terminal and the second output terminal; a third switch circuit controlling electrical coupling between the first input terminal and the first output terminal, and coupled in parallel to the first switch circuit; and a fourth switch circuit controlling electrical coupling between the first input terminal and the second output terminal, and coupled in parallel to the second switch circuit. In a case where a coupling destination of the first input terminal is switched from the first output terminal to the second output terminal, a third switching operation changing the third switch circuit from an ON state to an OFF state and a fourth switching operation changing the fourth switch circuit from the OFF state to the ON state are finished, after a first switching operation changing the first switch circuit from the ON state to the OFF state and a second switching operation changing the second switch circuit from the OFF state to the ON state are finished.

Some embodiments will be explained hereinafter with reference to drawings. In the following description, constituent elements having substantially the same functions and structures will be denoted by the same reference numerals, and an overlapping explanation thereof may be omitted. All the descriptions of an embodiment is also applicable to another embodiment unless explicitly or obviously excluded.

In the present specification and the claims, the expression that a first element is "coupled" to a second element includes that the first element is coupled to the second element directly or via a constantly or selectively conductive element.

1. First Embodiment

The following is an explanation of a high frequency semiconductor integrated circuit 1 according to a first embodiment. In the present embodiment, a single pole double throw (SPDT) switch is explained as the high frequency semiconductor integrated circuit 1, as an example. The SPDT switch is a high frequency signal changeover switch having an input terminal and two output terminals. For example, the SPDT switch is formed on a silicon on insulator (SOI) substrate. The high frequency semiconductor integrated circuit 1 is not limited to a SPDT switch. A switching integrated circuit (IC) having three output terminals is also applicable. For example, the high frequency semiconductor integrated circuit 1 may be a single pole triple throw (SP3T) switch.

1.1 Configuration

First, an example of a whole configuration of the high frequency semiconductor integrated circuit 1 will be explained with reference to FIG. 1. FIG. 1 is a block diagram illustrating an example of a whole configuration of the high frequency semiconductor integrated circuit 1.

As illustrated in FIG. 1, the high frequency semiconductor integrated circuit 1 has an input terminal (high frequency signal input terminal) RFC receiving a high frequency signal from outside, an input terminal (control signal input terminal) CTRL receiving a control signal from the outside, and two output terminals (high frequency signal output terminals) RF1 and RF2 each outputting a high frequency signal to the outside. The high frequency semiconductor integrated circuit 1 electrically couples the input terminal RFC to the output terminal RF1 or RF2, based on the control signal input from the input terminal CTRL.

The high frequency semiconductor integrated circuit 1 includes switching units 2a and 2b and a buffer 3.

Each of the switching units 2a and 2b can function as a SPDT switch. The switching units 2a and 2b are coupled in parallel. Specifically, the high frequency semiconductor integrated circuit 1 includes two parallel SPDT switches. In other words, a SPDT switch is divided into two stages. For example, switching time of coupling in the switching unit 2a is shorter than switching time of coupling in the switching unit 2b. Specifically, the switching speed of the switching unit 2a is faster than the switching speed of the switching unit 2b. For this reason, for example, in a case of switching the coupling destination of the input terminal RFC, a switching operation in the switching unit 2b is finished after a switching operation in the switching unit 2a is finished. Specifically, the switching operation of coupling is executed with two steps. In the following explanation, the switching unit is expressed as "switching unit 2" in a case where it is not limited to one of the switching units 2a and 2b. Three or more switching units 2 may be provided. Specifically, three or more parallel SPDT switches may be provided.

The switching unit 2a includes two switch circuits SW1a and SW2a. One of the switch circuits SW1a and SW2a is set to an ON state, and the other is set to an OFF state, based on the control signal.

The switch circuit SW1a electrically couples the input terminal RFC to the output terminal RF1, based on the control signal input from a normal output terminal (+) of the buffer 3. One end of a current path of the switch circuit SW1a is coupled to the input terminal RFC, and the other end thereof is coupled to the output terminal RF1.

The switch circuit SW2a electrically couples the input terminal RFC to the output terminal RF2, based on an inverted signal of the control signal input from an inverting output terminal (−) of the buffer 3. One end of a current path of the switch circuit SW2a is coupled to the input terminal RFC, and the other end thereof is coupled to the output terminal RF2.

For example, in a case where the control signal is at a level "High" ("H"), the switch circuit SW1a is set to the ON state, and the switch circuit SW2a is set to the OFF state. For example, in a case where the control signal is at a level "Low" ("L"), the switch circuit SW1a is set to the OFF state, and the switch circuit SW2a is set to the ON state.

The switching unit 2b includes two switch circuits SW1b and SW2b. One of the switch circuits SW1b and SW2b is set to an ON state, and the other is set to an OFF state, based on the control signal.

The switch circuit SW1b electrically couples the input terminal RFC to the output terminal RF1, based on the control signal input from the normal output terminal (+) of the buffer 3. One end of a current path of the switch circuit SW1b is coupled to the input terminal RFC, and the other end thereof is coupled to the output terminal RF1. The switch circuit SW1a of the switching unit 2a and the switch circuit SW1b of the switching unit 2b are coupled in parallel between the input terminal RFC and the output terminal RF1.

The switch circuit SW2b electrically couples the input terminal RFC to the output terminal RF2, based on an inverted signal of the control signal input from the inverting output terminal (−) of the buffer 3. One end of a current path of the switch circuit SW2b is coupled to the input terminal RFC, and the other end thereof is coupled to the output terminal RF2. The switch circuit SW2a of the switching unit 2a and the switch circuit SW2b of the switching unit 2b are coupled in parallel between the input terminal RFC and the output terminal RF2.

For example, in a case where the control signal is at a level "High" ("H"), the switch circuit SW1b is set to the ON state, and the switch circuit SW2b is set to the OFF state. For example, in a case where the control signal is at a level "Low" ("L"), the switch circuit SW1b is set to the OFF state, and the switch circuit SW2b is set to the ON state.

The buffer 3 includes an input terminal, the normal output terminal (+), and the inverting output terminal (−). The input terminal of the buffer 3 is coupled to the input terminal CTRL. The normal output terminal (+) of the buffer 3 is coupled to the switch circuits SW1a and SW1b. The inverting output terminal (−) of the buffer 3 is coupled to the switch circuit SW2a and SW2b. The buffer 3 outputs the control signal from the normal output terminal (+), and outputs an inverted signal of the control signal from the inverting output terminal (−).

1.2 Circuit Configuration of Switch Circuit

The following is an explanation of an example of a circuit configuration of each of the switch circuits SW1a, SW1b, SW2a, and SW2b with reference to FIG. 2. FIG. 2 is a circuit diagram illustrating an example of the switch circuits SW1a, SW1b, SW2a, and SW2b. In the following explanation, in a case where a source and a drain of a transistor is not limited, one of the source and the drain of the transistor is referred to as "one end of the transistor", and the other of the source and the drain of the transistor is referred to as "the other end of the transistor".

First, the switch circuit SW1a will be explained hereinafter.

As illustrated in FIG. 2, the switch circuit SW1a includes a plurality of n-type metal oxide semiconductor field effect transistors (MOSFETs) 11a, a plurality of resistive elements 12a, and a plurality of resistive elements 13a. Each of the transistors 11a functions as a switching element. The number of transistors 11a, the number of resistive elements 12a, and the number of resistive elements 13a included in the switch circuit SW1a are equal to each other.

The transistors 11a are coupled in series between the input terminal RFC and the output terminal RF1. A gate of each transistor 11a is coupled to one terminal of each resistive element 13a. The number and the transistor size of transistors 11a are based on, for example, the amplitude level of the high frequency signal to be transmitted and the like. In addition, for example, the gate width Wga of each transistor 11a is determined, based on an insertion loss (IL) in transmission of the high frequency signal or the like.

Each resistive element 12a is coupled in parallel to each transistor 11a. More specifically, one terminal of each resistive element 12a is coupled to one end of each transistor 11a, and the other terminal thereof is coupled to the other end of each transistor 11a. In the following explanation, the resistance value of each resistive element 12a is referred to as "Rds".

Each resistive element 13a is disposed to, for example, suppress leakage of current (high frequency signal) to the gate side of each transistor 11a. One terminal of each resistive element 13a is coupled to the gate of each transistor 11a, and the other terminal thereof is coupled to the normal output terminal (+) of the buffer 3. In the following explanation, the resistance value of each resistive element 13a is referred to as "Rgga".

The following is an explanation of the switch circuit SW1b. The switch circuit SW1b includes a plurality of n-type MOSFETs 11b, a plurality of resistive elements 12b, and a plurality of resistive elements 13b. The number of transistors 11b, the number of resistive elements 12b, and the number of resistive elements 13b included in the switch circuit SW1b are equal to each other. For example, the switch circuit SW1b includes the same number of transistors 11b as the number of transistors 11a of the switch circuit SW1a.

The transistors 11b are coupled in series between the input terminal RFC and the output terminal RF1. A gate of each transistor 11b is coupled to one terminal of each resistive element 13b. In the following explanation, the gate width of each transistor 11b is referred to as "Wgb".

Each resistive element 12b is coupled in parallel to each transistor 11b. More specifically, one terminal of each resistive element 12b is coupled to one end of each transistor 11b, and the other terminal thereof is coupled to the other end of each transistor 11b. The resistance value of each resistive element 12b is "Rds" that is the same as that of each resistive element 12a.

One terminal of each resistive element 13b is coupled to the gate of each transistor 11b, and the other terminal thereof is coupled to the normal output terminal (+) of the buffer 3. In the following explanation, the resistance value of each resistive element 13b is referred to as "Rggb".

The following is an explanation of the switch circuit SW2a. The switch circuit SW2a includes a plurality of n-type MOSFETs 21a, a plurality of resistive elements 22a, and a plurality of resistive elements 23a. The number of transistors 21a, the number of resistive elements 22a, and the number of resistive elements 23a included in the switch circuit SW2a are equal to each other. For example, the switch circuit SW2a includes the same number of transistors 21a as the number of transistors 11a of the switch circuit SW1a.

The transistors 21a are coupled in series between the input terminal RFC and the output terminal RF2. A gate of each transistor 21a is coupled to one terminal of each resistive element 23a. The gate width of each transistor 21a is "Wga" that is the same as that of each transistor 11a.

Each resistive element 22a is coupled in parallel to each transistor 21a. More specifically, one terminal of each resistive element 22a is coupled to one end of each transistor 21a, and the other terminal thereof is coupled to the other end of each transistor 21a. The resistance value of each resistive element 22a is "Rds" that is the same as that of each resistive element 12a.

One terminal of each resistive element 23a is coupled to the gate of each transistor 21a, and the other terminal thereof is coupled to the inverting output terminal (−) of the buffer 3. The resistance value of each resistive element 23a is "Rgga" that is the same as that of each resistive element 13a.

The following is an explanation of the switch circuit SW2b. The switch circuit SW2b includes a plurality of n-type MOSFETs 21b, a plurality of resistive elements 22b, and a plurality of resistive elements 23b. The number of transistors 21b, the number of resistive elements 22b, and the number of resistive elements 23b included in the switch circuit SW2b are equal to each other. For example, the switch circuit SW2b includes the same number of transistors 21b as the number of transistors 11a of the switch circuit SW1a.

The transistors 21b are coupled in series between the input terminal RFC and the output terminal RF2. A gate of each transistor 21b is coupled to one terminal of each resistive element 23b. The gate width of each transistor 21b is "Wgb" that is the same as that of each transistor 11b.

Each resistive element 22b is coupled in parallel to each transistor 21b. More specifically, one terminal of each resistive element 22b is coupled to one end of each transistor 21b, and the other terminal thereof is coupled to the other end of the transistor 21b. The resistance value of each resistive element 22b is "Rds" that is the same as that of each resistive element 12a.

One terminal of each resistive element 23b is coupled to the gate of each transistor 21b, and the other terminal thereof is coupled to the inverting output terminal (−) of the buffer 3. In the following explanation, the resistance value of each resistive element 23b is "Rggb" that is the same as that of each resistive element 13b.

In the present embodiment, for example, the gate widths Wga and Wgb and the resistive values Rgga and Rggb have the relations "Wga=Wgb" and "Rgga<Rggb" or "Wga<Wgb" and "Rgga=Rggb". The gate widths Wga and Wgb and the resistive values Rgga and Rggb may have the relations "Wga<Rgb" and "Rgga<Rggb".

In the following explanation, the switch circuit is expressed as "switch circuit SW" in a case where it is not limited to one of the switch circuits SW1a, SW1b, SW2a, and SW2b.

1.3 Operating Characteristics of Switch Circuit

The following is an explanation of operating characteristics of the switch circuit SW with reference to FIG. 3. FIG. 3 is a graph illustrating switching operations of the switch circuits SW1a, SW1b, SW2a, and SW2b. The vertical axis of the graph indicates a gate voltage Vg (voltage of the control signal). The horizontal axis of the graph indicates the time. In FIG. 3, a solid line indicates the transistors 11a of the switch circuit SW1a and the transistors 21a of the switch circuit SW2a. A broken line indicates the transistors 11b of the switch circuit SW1b and the transistors 21b of the switch circuit SW2b.

In the switching operation of the switch circuit SW, in a case where the transistor is changed from the OFF state to the ON state, or in a case where the transistor is changed from the ON state to the OFF state, the switching time is proportional to a CR time constant based on the gate capacitance and the gate resistance of the transistor. For example, the gate capacitance is proportional to the gate width of the transistor. In addition, the gate resistance increases as the resistance value of the resistive element coupled to the gate of the transistor increases.

In the following explanation, Ton denotes the length of rise time until the gate voltage Vg of the transistor becomes equal to or higher than a threshold voltage and the transistor (switch circuit SW) is changed from the OFF state to the ON state. In addition, Toff denotes the length of fall time until the gate voltage Vg of the transistor becomes smaller than the threshold voltage and the transistor (switch circuit SW) is changed from the ON state to the OFF state.

As illustrated in FIG. 3, the CR time constant in the switch circuits SW1b and SW2b is larger than the CR time constant in the switch circuits SW1a and SW2a. In this case, the rise time Ton and the fall time Toff of the switch circuits SW1b and SW2b are longer than the rise time Ton and the fall time Toff of the switch circuits SW1a and SW2a, respectively.

More specifically, the gate width Wga of the transistors 11a and 21a, the gate width Wgb of the transistors 11b and 21b, the resistance value Rgga of the resistive elements 13a and 23a, and the resistance value Rggb of the resistive elements 13b and 23b have the relations "Wga=Wgb" and "Rgga<Rggb" or the relations "Wga<Wgb" and "Rgga=Rggb". For this reason, the CR time constant in the switch circuits SW1b and SW2b is larger than the CR time constant in the switch circuits SW1a and SW2a.

Accordingly, the switching operation (switching speed) of the switch circuits SW1b and SW2b is slower than the switching operation (switching speed) of the switch circuits SW1a and SW2a. Specifically, the switch circuits SW1b and SW2b are delayed with respect to the switch circuits SW1a and SW2a. In other words, the switching operation (switching speed) of the switching unit 2b is delayed with respect to the switching operation (switching speed) of the switching unit 2a.

The rise time Ton and the fall time Toff vary due to manufacturing variations or fluctuations of the threshold voltage caused by the operation temperature or the like. For this reason, for example, even when the rise operation of the switch circuit SW1a (transistors 11a) and the fall operation of the switch circuit SW2a (transistors 21a) of the switching unit 2a are started simultaneously, the timings at which the respective operations are finished may be shifted. The same is also applicable to the switching unit 2b.

1.4 Specific Example of Switching Operation

The following is an explanation of a specific example of switching order in a case of changing coupling of the input terminal RFC from the output terminal RF1 to the output terminal RF2 with reference to FIG. 4 to FIG. 6. FIG. 4 illustrates a switching order in a case where the length of the rise time Ton is equal to the length of the fall time Toff in switching operations. Specifically, FIG. 4 illustrates the case where the operation of turning on the transistors and the operation of turning off the transistors in the switching unit 2 are finished at the same timing. FIG. 5 illustrates a switching order in a case where the length of the rise time Ton is shorter than the length of the fall time Toff in the switching operations. Specifically, FIG. 5 illustrates the case where the operation of turning on the transistors is finished earlier than the operation of turning off the transistors in the switching unit 2. FIG. 6 illustrates a switching order in a case where the length of the rise time Ton is longer than the length of the fall time Toff in the switching operations. Specifically, FIG. 6 illustrates the case where the operation of turning off the transistors is finished earlier than the operation of turning on the transistors in the switching unit 2. In the examples in FIG. 4 to FIG. 6, suppose that the ON resistance Ron of each of the switch circuits SW1a, SW1b, SW2a, and SW2b is 10Ω. Suppose that a characteristic impedance in a state in which the input terminal RFC is coupled to one of the output terminals RF1 and RF2 is 50Ω. In addition, for example, the resistance value Rgga and the resistance value Rggb have the relation "Rgga<Rggb", and the gate width Wga and the gate width Wgb have the relation "Wga=Wgb".

First, the following is an explanation of a case where the operation of turning on the transistors and the operation of turning off the transistors in the switching unit 2 are finished at the same timing.

As illustrated in FIG. 4, at Step 0, the input terminal RFC is coupled to the output terminal RF1. For this reason, the switch circuits SW1a and SW1b are set to the ON state, and the switch circuits SW2a and SW2b are set to the OFF state. For example, a port impedance (hereinafter referred to as "RFC impedance") in the input terminal RFC in this state is 55Ω.

Step 1 is a step to set the input terminal RFC to a state of being coupled to both the output terminals RF1 and RF2 (hereinafter also referred to as "simultaneous ON state"). At Step 1, a switching operation in the switching unit 2a is finished. More specifically, the switch circuit SW1a is changed from the ON state to the OFF state. In addition, the switch circuit SW2a is changed from the OFF state to the ON state. As a result, the switch circuits SW1b and SW2a are set to the ON state. In this manner, the input terminal RFC is coupled to the output terminals RF1 and RF2. The RFC impedance is reduced to 30Ω.

At Step 2, a switching operation in the switching unit 2b is finished. More specifically, the switch circuit SW1b is changed from the ON state to the OFF state. In addition, the switch circuit SW2b is changed from the OFF state to the ON state. As a result, the switch circuits SW2a and SW2b are set to the ON state. In this manner, the input terminal RFC is coupled to the output terminal RF2. The RFC impedance is 55Ω.

The following is an explanation of the case where the operation of turning on the transistors is finished earlier than the operation of turning off the transistors in the switching unit 2.

As illustrated in FIG. 5, in the switching units 2a and 2b, the timing at which the transistors are changed to the ON state is different from the timing at which the transistors are changed to the OFF state. For this reason, intermediate steps are generated between Step 0 and Step 1 and between Step 1 and Step 2. In the following explanation, the step between Step 0 and Step 1 is referred to as "Step 0.5". The step between Step 1 and Step 2 is referred to as "Step 1.5".

The state at Step 0 is the same as that in FIG. 4.

Thereafter, at Step 0.5, transition of the transistors 21a in the switching unit 2a to the ON state is finished. More specifically, the switch circuit SW1a is maintained at the ON state. The switch circuit SW2a is changed from the OFF state to the ON state. As a result, the switch circuits SW1a, SW1b, and SW2a are set to the ON state. In this manner, the input terminal RFC is coupled to the output terminals RF1 and RF2. The RFC impedance is reduced to 29Ω.

At Step 1, transition of the transistors 11a in the switching unit 2a to the OFF state is finished. The states of the switch circuits SW1a, SW1b, SW2a, and SW2b are the same as those in FIG. 4.

Thereafter, at Step 1.5, transition of the transistors 21b in the switching unit 2b to the ON state is finished. More specifically, the switch circuit SW1b is maintained at the ON state. The switch circuit SW2b is changed from the OFF state to the ON state. As a result, the switch circuits SW1b, SW2a, and SW2b are set to the ON state. In this manner, the input terminal RFC is coupled to the output terminals RF1 and RF2. The RFC impedance is reduced to 29Ω.

At Step 2, transition of the transistors 11b in the switching unit 2b to the OFF state is finished. The states of the switch circuits SW1a, SW1b, SW2a, and SW2b are the same as those in FIG. 4.

The following is an explanation of the case where the operation of turning off the transistors is finished earlier than the operation of turning on the transistors in the switching unit 2.

As illustrated in FIG. 6, in the switching units 2a and 2b, the timing at which the transistors are changed to the ON state is different from the timing at which the transistors are changed to the OFF state. For this reason, intermediate steps are generated between Step 0 and Step 1 and between Step 1 and Step 2.

The state at Step 0 is the same as that in FIG. 4.

Thereafter, at Step 0.5, transition of the transistors 11a in the switching unit 2a to the OFF state is finished. More specifically, the switch circuit SW1a is changed from the ON state to the OFF state. The switch circuit SW2a is maintained at the OFF state. As a result, the switch circuit SW1b is set to the ON state. In this manner, the input terminal RFC is coupled to the output terminal RF1. The RFC impedance is increased to 60Ω.

At Step 1, transition of the transistors 21a in the switching unit 2a to the ON state is finished. The states of the switch circuits SW1a, SW1b, SW2a, and SW2b are the same as those in FIG. 4.

Thereafter, at Step 1.5, transition of the transistors 11b in the switching unit 2b to the OFF state is finished. More specifically, the switch circuit SW1b is changed from the ON state to the OFF state. The switch circuit SW2b is maintained at the OFF state. As a result, the switch circuit SW2a is set to the ON state. In this manner, the input terminal RFC is coupled to the output terminal RF2. The RFC impedance is increased to 60Ω.

At Step 2, transition of the transistors 21b in the switching unit 2b to the ON state is finished. The states of the switch circuits SW1a, SW1b, SW2a, and SW2b are the same as those in FIG. 4.

1.5 Advantageous Effect of Present Embodiment

The structure according to the present embodiment provides a high frequency semiconductor integrated circuit capable of suppressing fluctuations of the impedance accompanying switching control and improving the switching speed. The effect will be explained with reference to FIG. 7.

FIG. 7 is a diagram illustrating an example of relation between the number of parallels of the SPDT switches and the order of switching operations. (a) of FIG. 7 illustrates the case where the number of parallels of the SPDT switches is 1 (one-stage SPDT switch), as a comparative example. (b) of FIG. 7 illustrates the case where the number of parallels of the SPDT switches explained in the present embodiment is 2 (two-stage SPDT switch). The structure of (b) of FIG. 7 is the same as the first embodiment. The example of FIG. 7 illustrates the case of switching the coupling of the input terminal RFC from the output terminal RF1 to the output terminal RF2. In (a) of FIG. 7, the ON resistance Ron of each of the switch circuits SW1 and SW2 is 5Ω. The ON resistance Ron of each of the switch circuits SW1a, SW1b, SW2a, and SW2b in (b) of FIG. 7 is 10Ω. To simplify the explanation, the example of FIG. 7 illustrates the case where the length of the rise time Ton of the transistors is equal to the length of the fall time Toff.

In a high frequency switch circuit, such as a SPDT switch, there are cases where fluctuations of the impedance in the switching operation should be suppressed according to its use, such as the case of switching the output terminals with the power input state maintained (also referred to as "hot switch") and the case where oscillation of the element of the stage before the input terminal should be suppressed. If no control is executed for the operation of switching coupling of the input terminal and each output terminal, such a state may cause a state in which the input terminal is not coupled to any of the output terminals (hereinafter referred to as "simultaneous OFF state"). When the simultaneous OFF state occurs, the impedance becomes very large (open state). For this reason, the switching order of coupling between the input terminal and each of the output terminals is controlled.

For example, in the SPDT switch, to avoid the simultaneous OFF state, coupling is switched (as illustrated in Step 2 of (a) of FIG. 7) via the state (simultaneous ON state) in which the two output terminals are coupled to the input terminal, as illustrated in Step 1 of (a) of FIG. 7. For example, the RFC impedance in the simultaneous ON state is half (for example, 27.5Ω) of that (for example, 55Ω) in the state in which the input terminal is coupled to one of the output terminals. As described above, to perform control to prevent occurrence of the simultaneous OFF state, a time difference is provided between the rise operation and the fall operation of the switching elements (transistors). More specifically, control is performed such that the timing of the rise operation of the transistors is earlier than the timing of the fall operation. For this reason, control of the switching operations becomes complicated. In addition, this structure requires a delay circuit to delay the fall timing. In this case, it is required to set delay time with margin in consideration of fluctuations of the length of the rise time and the length of the fall time due to fluctuations of the threshold voltage of the transistors, and the time required for the switching operation becomes comparatively long.

By contrast, with the structure according to the present embodiment, the high frequency semiconductor integrated circuit 1 can be provided with a plurality of parallels of switching units 2 switching coupling between the input terminal and each of the output terminals, as illustrated in (b) of FIG. 7. This structure can set finish of the switching operations in the switching units 2 to different timings. This structure prevents occurrence of the simultaneous OFF state in the switching operation. More specifically, for example, the high frequency semiconductor integrated circuit 1 includes switching units 2a and 2b. The timing of finish of the switching operations of the switch circuits SW1b and SW2b of the switching unit 2b is later than the timing of finish of the switching operations of the switch circuits SW1a and SW2a of the switching unit 2a. In the switching operations, the switching operation of the switching unit 2a is finished earlier, and thereby the simultaneous ON state is achieved (Step 1 of (b) of FIG. 7). Thereafter, the switching operation of the switching unit 2b is finished, and thereby the switching operations are finished (Step 2 of (b) of FIG. 7). Delay can be generated in the timing of the switching operation between the switching units 2a and 2b. For this reason, even in the case where the length of the rise time of the transistors is different from the length of the fall time, occurrence of the simultaneous OFF state can be prevented. Specifically, this structure eliminates the need for setting of delay time in consideration of fluctuations of the threshold voltage of the transistors. Accordingly, this structure improves the switching speed.

In addition, with the structure according to the present embodiment, for example, if two parallel SPDT switches are provided as illustrated in FIG. 7, the ON resistance Ron of each of the transistors of each switch circuit can be set twice as large as that in the case where the SPDT switch has a one-parallel structure, to set the RFC impedance equal to that in the case where the SPDT switch has a one-parallel structure. In this manner, the RFC impedance in the simultaneous ON state can be set higher than that in the case where the SPDT switch has a one-parallel structure. Specifically, this structure can suppress fluctuations of the RFC impedance in the switching operation.

In addition, with the structure according to the present embodiment, because the ON resistance Ron is twice, the gate widths Wga and Wgb can be reduced in comparison with the gate width Wg in the case where the SPDT switch has a one-parallel structure. This structure reduces the gate capacitance (CR time constant) of the transistors. For this reason, the switching speed (transition time) of the transistors can be shortened in comparison with the case where the SPDT switch has a one-parallel structure. Accordingly, this structure can improve the switching speed of the high frequency semiconductor integrated circuit 1.

In addition, with the structure according to the present embodiment, the timing of finishing the switching operation in the switching unit 2 can be delayed by optimizing the CR time constant in each of the switching unit 2. This structure can omit the delay circuit. This structure can suppress increase in chip area of the high frequency semiconductor integrated circuit.

1.6 Modification of First Embodiment

The following is an explanation of relation between the split ratio of the gate width Wga and the gate width Wgb and the RFC impedance. FIG. 8 is a schematic diagram of the high frequency semiconductor integrated circuit 1 illustrating relation between the gate widths Wga and Wgb. FIG. 9 is a graph illustrating relation between a split ratio of the gate widths Wga and Wgb and RFC impedance in a case where the switch circuits SW1a and SW2a are in the ON state.

As illustrated in FIG. 8, for example, suppose that the gate width Wg in the case where the SPDT switch has a one-parallel structure as illustrated in (a) of FIG. 7 is "1", and the split ratio in the case where the gate width Wg is divided into the gate widths Wga and Wgb is X. In this case, the gate width Wga can be expressed as "WX", and the gate width Wgb can be expressed as "W(1−X)". Specifically, the relation "Wg=(WX+W(1−X))" is established. The gate widths do not necessarily have the relation "Wg=(WX+W(1−X))".

As illustrated in FIG. 9, in a case where the split ratio X is varied from 0.1 to 0.9, the RFC impedance in a case where the switch circuits SW1a and SW2a are in the ON state (simultaneous ON state) has a graph symmetrical with a line of X=0.5 serving as the center. The RFC impedance at the time when "X=0.5" is satisfied is 30Ω and lowest in comparison with the other split ratios X. In addition, the RFC impedance tends to increase from 30Ω as X decreases or increases. A broken line in FIG. 9 indicates the RFC impedance (27.5Ω) in the case where the SPDT switch has a one-parallel structure. In the case where two parallel SPDT switches are provided, the RFC impedance is 30Ω or more under any conditions and larger than the RFC impedance (27.5Ω) in the case where the SPDT switch has a one-parallel structure. Specifically, by adopting two parallel SPDT switches, the RFC impedance in the simultaneous ON state is higher than that in the case where the SPDT switch has a one-parallel structure. Specifically, this structure reduces fluctuations of the impedance due to the switching operation.

1.7 Advantageous Effect of Modification of First Embodiment

The structure according to the modification of the present embodiment enables control of the RFC impedance in the case where the switch circuits SW1a and SW2a are in the ON state (simultaneous ON state) by controlling the split ratio X of the gate widths Wga and Wgb. This structure suppresses fluctuations of the RFC impedance in the simultaneous ON state.

2. Second Embodiment

A second embodiment will be explained hereinafter. The second embodiment illustrates a configuration of the high frequency semiconductor integrated circuit 1 different from the first embodiment. The following explanation mainly illustrates points different from the first embodiment.

2.1 Configuration

First, the following is an explanation of an example of a whole configuration of the high frequency semiconductor integrated circuit 1 with reference to FIG. 10. FIG. 10 is a block diagram illustrating an example of a whole configuration of the high frequency semiconductor integrated circuit 1 according to the second embodiment.

As illustrated in FIG. 10, the high frequency semiconductor integrated circuit 1 includes switching units 2a and 2b, a buffer 3, and resistive elements 4_1 and 4_2.

In the present embodiment, resistive elements 4 are provided between the buffer 3 and the switching unit 2b to delay the switching unit 2b with respect to the switching unit 2a. More specifically, a normal output terminal (+) of the buffer 3 is coupled to the switch circuit SW1b via the resistive element 4_1. An inverting output terminal (−) of the buffer 3 is coupled to the switch circuit SW2b via the resistive element 4_2. For example, the resistive elements 4_1 and 4_2 have the same resistance value Rcn. With the resistive elements 4_1 and 4_2, the switching operation of the switching unit 2b is delayed with respect to the switching unit 2a.

The other structures thereof are the same.

2.2 Circuit Configuration of Switch Circuit

The following is an explanation of an example of a circuit configuration of each of the switch circuits SW1a, SW1b, SW2a, and SW2b with reference to FIG. 11. FIG. 11 is a circuit diagram illustrating an example of a circuit configuration of each of the switch circuits SW1a, SW1b, SW2a, and SW2b.

As illustrated in FIG. 11, the configuration of the switch circuits SW1a, SW1b, SW2a, and SW2b is the same as that illustrated in FIG. 2 according to the first embodiment.

One terminals of a plurality of resistive elements 13b of the switch circuit SW1b are coupled to respective gates of a plurality of transistors 11b. The other terminals of the resistive elements 13b are coupled in common to one terminal of the resistive element 4_1. The other terminal of the resistive element 4_1 is coupled to the normal output terminal (+) of the buffer 3.

One terminals of a plurality of resistive elements 23b of the switch circuit SW2b are coupled to respective gates of a plurality of transistors 21b. The other terminals of the resistive elements 23b are coupled in common to one terminal of the resistive element 4_2. The other terminal of the resistive element 4_2 is coupled to the inverting output terminal (−) of the buffer 3.

In the present embodiment, with the resistive elements 4_1 and 4_2, the switching operations of the switch circuits SW1b and SW2b are delayed with respect to the switch circuits SW1a and SW2a. For this reason, for example, the transistors 11a, 11b, 21a, and 21b and the resistive elements 13a, 13b, 23a, and 23b may have the relations "Wga=Wgb" and "Rgga=Rggb".

2.3 Advantageous Effect of Present Embodiment

The structure according to the present embodiment produces the same effects as those of the first embodiment.

3. Third Embodiment

A third embodiment will be explained hereinafter. The third embodiment illustrates a configuration of the high frequency semiconductor integrated circuit 1 different from the first and the second embodiments. The following explanation mainly illustrates points different from the first and the second embodiments.

3.1 Configuration

First, the following is an explanation of an example of a whole configuration of the high frequency semiconductor integrated circuit 1 with reference to FIG. 12. FIG. 12 is a block diagram illustrating an example of a whole configuration of the high frequency semiconductor integrated circuit 1.

As illustrated in FIG. 12, the high frequency semiconductor integrated circuit 1 includes switching units 2a and 2b, buffers 3a and 3b, and a delay circuit 5.

The switching units 2a and 2b are the same as those in FIG. 1 according to the first embodiment.

The buffer 3a includes an input terminal, a normal output terminal (+), and an inverting output terminal (−). The input terminal of the buffer 3a is coupled to an input terminal CTRL. The normal output terminal (+) of the buffer 3a is coupled to a switch circuit SW1a. The inverting output terminal (−) of the buffer 3a is coupled to a switch circuit SW2a. The buffer 3a outputs a control signal from the normal output terminal (+), and outputs an inverted signal of the control signal from the inverting output terminal (−).

The buffer 3b includes an input terminal, a normal output terminal (+), and an inverting output terminal (−). The input terminal of the buffer 3b is coupled to an output terminal of the delay circuit 5. The normal output terminal (+) of the buffer 3b is coupled to a switch circuit SW1b. The inverting output terminal of the buffer 3b is coupled to a switch circuit SW2b. The buffer 3b outputs a control signal from the normal output terminal (+), and outputs an inverted signal of the control signal from the inverting output terminal (−).

The delay circuit 5 delays the control signal and transmits the control signal to the buffer 3b. An input terminal of the delay circuit 5 coupled to the input terminal CTRL. An output terminal of the delay circuit 5 is coupled to the input terminal of the buffer 3b.

In the present embodiment, with the delay circuit 5, the switching operation of the switching unit 2b is delayed with respect to the switching unit 2a.

3.2 Circuit Configuration of Switch Circuit

The following is an explanation of an example of a circuit configuration of each of the switch circuits SW1a, SW1b, SW2a, and SW2b with reference to FIG. 13. FIG. 13 is a circuit diagram illustrating an example of a circuit configuration of each of the switch circuits SW1a, SW1b, SW2a, and SW2b.

As illustrated in FIG. 13, the configuration of the switch circuits SW1a, SW1b, SW2a, and SW2b is the same as that illustrated in FIG. 2 according to the first embodiment.

One terminals of a plurality of resistive elements 13a of the switch circuit SW1a are coupled to respective gates of a plurality of transistors 11a. The other terminals of the resistive elements 13a are coupled in common to the normal output terminal (+) of the buffer 3a.

One terminals of a plurality of resistive elements 13b of the switch circuit SW1b are coupled to respective gates of a plurality of transistors 11b. The other terminals of the resistive elements 13b are coupled in common to the normal output terminal (+) of the buffer 3b.

One terminals of a plurality of resistive elements 23a of the switch circuit SW2a are coupled to respective gates of a plurality of transistors 21a. The other terminals of the resistive elements 23a are coupled in common to the inverting output terminal (−) of the buffer 3a.

One terminals of a plurality of resistive elements 23b of the switch circuit SW2b are coupled to respective gates of a plurality of transistors 21b. The other terminals of the resistive elements 23b are coupled in common to the inverting output terminal (−) of the buffer 3b.

In the present embodiment, with the delay circuit 5, the switching operations of the switch circuits SW1b and SW2b are delayed with respect to the switch circuits SW1a and SW2a. For this reason, for example, the transistors 11a, 11b, 21a, and 21b and the resistive elements 13a, 13b, 23a, and 23b may have the relations "Wga=Wgb" and "Rgga=Rggb".

3.3 Circuit Configuration of Delay Circuit

Figure 14:
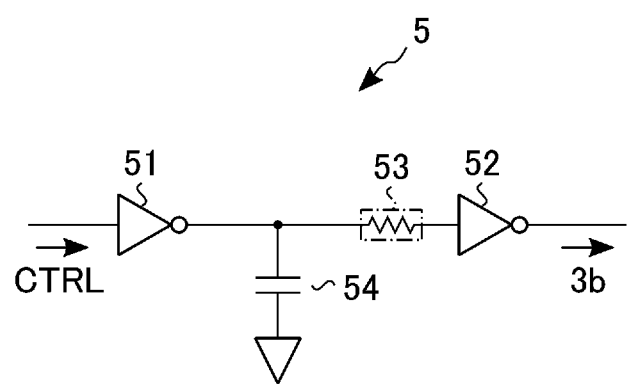
FIG. 14 is a circuit diagram of a delay circuit included in the high frequency semiconductor integrated circuit according to the third embodiment.

The following is an explanation of an example of a circuit configuration of the delay circuit 5 with reference to FIG. 14. FIG. 14 is a circuit diagram of the delay circuit 5.

As illustrated in FIG. 14, the delay circuit 5 includes, for example, inverters 51 and 52, a resistive element 53, and a capacitive element 54.

An input terminal of the inverter 51 is coupled to an input terminal CTRL. An output terminal of the inverter 51 is coupled to one terminal of the resistive element 53 and one electrode of the capacitive element 54.

An input terminal of the inverter 52 is coupled to the other terminal of the resistive element 53. The output terminal of the inverter 52 is coupled to the input terminal of the buffer 3b.

The other terminal of the capacitive element 54 is grounded (coupled to a ground voltage line).

The control signal is delayed with a CR time constant based on a pair of the resistive element 53 and the capacitive element 54. Based on the set delay time, the resistance value of the resistive element 53 and the capacitive value of the capacitive element 54 are set to any values. Based on the set delay time, a plurality of pairs of resistive elements 53 and capacitive elements 54 may be provided in series, or a plurality of delay circuits 5 may be provided in series.

3.4 Advantageous Effect of Present Embodiment

The structure according to the present embodiment produces the same effects as those of the first embodiment.

4. Fourth Embodiment

A fourth embodiment will be explained hereinafter. The fourth embodiment illustrates a configuration of the high frequency semiconductor integrated circuit 1 different from the first to the third embodiments. The following explanation mainly illustrates points different from the first to the third embodiments.

4.1 Configuration

The following is an explanation of an example of a whole configuration of the high frequency semiconductor integrated circuit 1 with reference to FIG. 15. FIG. 15 is a block diagram illustrating an example of a whole configuration of the high frequency semiconductor integrated circuit 1.

As illustrated in FIG. 15, the high frequency semiconductor integrated circuit 1 includes switching units 2a and 2b, a buffer 3, and delay circuits 5_1 and 5_2.

The switching units 2a and 2b are the same as those in FIG. 1 according to the first embodiment.

The buffer 3 includes an input terminal, a normal output terminal (+), and an inverting output terminal (−). The input terminal of the buffer 3 is coupled to an input terminal CTRL. The normal output terminal (+) of the buffer 3 of the present embodiment is coupled to a switch circuit SW1a and an input terminal of the delay circuit 5_1. The inverting output terminal (−) of the buffer 3 is coupled to a switch circuit SW2a and an input terminal of the delay circuit 5_2.

The delay circuit 5_1 delays the control signal received from the buffer 3 and transmits the control signal to the switch circuit SW1b. An output terminal of the delay circuit 5_1 is coupled to the switch circuit SW1b.

The delay circuit 5_2 delays an inverted signal of the control signal received from the buffer 3 and transmits the inverted signal to the switch circuit SW2b. An output terminal of the delay circuit 5_2 is coupled to the switch circuit SW2b.

The structures of the delay circuits 5_1 and 5_2 may be mutually the same. As another example, the structures of the delay circuits 5_1 and 5_2 may be the same as that illustrated in FIG. 14 according to the third embodiment.

In the present embodiment, the switching operation of the switch circuit SW1b is delayed with respect to the switch circuit SW1a by the delay circuit 5_1. The switching operation of the switch circuit SW2b is delayed with respect to the switch circuit SW2a by the delay circuit 5_2.

4.2 Advantageous Effect of Present Embodiment

The structure according to the present embodiment produces the same effects as those of the first embodiment.

5. Fifth Embodiment

A fifth embodiment will be explained hereinafter. The fourth embodiment illustrates a case where three switching units 2 are provided to form three parallels.

5.1 Configuration

First, the following is an explanation of an example of a whole configuration of the high frequency semiconductor integrated circuit 1 with reference to FIG. 16. FIG. 16 is a block diagram illustrating an example of a whole configuration of the high frequency semiconductor integrated circuit 1.

As illustrated in FIG. 16, the high frequency semiconductor integrated circuit 1 includes switching units 2a, 2b, and 2c, and a buffer 3.

Each of the switching units 2a, 2b, and 2c can function as a SPDT switch. The switching units 2a, 2b, and 2c are coupled in parallel. Specifically, the high frequency semiconductor integrated circuit 1 includes three parallel SPDT switches. In other words, the SPDT switch is divided into three stages. For example, the length of switching time in the switching unit 2a is shorter than the length of the switching time in the switching unit 2b. The length of switching time in the switching unit 2b is shorter than the length of the switching time in the switching unit 2c. For this reason, for example, in the case of switching the coupling destination of the input terminal RFC, the switching operation in the switching unit 2b is finished after the switching operation in the switching unit 2a is finished. In addition, the switching operation in the switching unit 2c is finished after the switching operation in the switching unit 2b is finished. Specifically, the switching operation is executed with three steps. In the following explanation, the switching unit is expressed as "switching unit 2" in a case where it is not limited to one of the switching units 2a, 2b, and 2c.

The structures of the switching units 2a and 2b are the same as those in FIG. 1 according to the first embodiment.

The switching unit 2c includes two switch circuits SW1c and SW2c. One of the switch circuits SW1c and SW2c is set to an ON state, and the other is set to an OFF state, based on the control signal.

The switch circuit SW1c electrically couples the input terminal RFC to the output terminal RF1, based on the control signal input from a normal output terminal (+) of the buffer 3. One end of the switch circuit SW1c is coupled to the input terminal RFC, and the other end thereof is coupled to the output terminal RF1.

The switch circuit SW2c electrically couples the input terminal RFC to the output terminal RF2, based on an inverted signal of the control signal input from an inverting output terminal (−) of the buffer 3. One end of the switch circuit SW2c is coupled to the input terminal RFC, and the other end thereof is coupled to the output terminal RF2.

For example, in a case where the control signal is at a level "H", the switch circuit SW1c is set to the ON state, and the switch circuit SW2c is set to the OFF state. For example, in a case where the control signal is at a level "L", the switch circuit SW1c is set to the OFF state, and the switch circuit SW2c is set to the ON state.

The normal output terminal (+) of the buffer 3 is coupled to the switch circuits SW1a, SW1b, and SW1c. The inverting output terminal (−) of the buffer 3 is coupled to the switch circuits SW2a, SW2b, and SW2c.

5.2 Circuit Configuration of Switch Circuit

The following is an explanation of an example of a circuit configuration of each of the switch circuits SW1a, SW1b, SW1c, SW2a, SW2b, and SW2c with reference to FIG. 17. FIG. 17 is a diagram illustrating an example of a circuit configuration of each of switch circuits SW1a, SW1b, SW1c, SW2a, SW2b, and SW2C. The circuit configuration of each of the switch circuits SW1a, SW1b, SW2a, and SW2b is the same as that illustrated in FIG. 2 of the first embodiment. For this reason, in the example of FIG. 17, the circuit configuration of each of the switch circuits SW1a, SW1b, SW2a, and SW2b is omitted to simplify the explanation.

First, the switch circuit SW1c will be explained.

As illustrated in FIG. 17, the switch circuit SW1c includes a plurality of n-type MOSFETs 11c, a plurality of resistive elements 12c, and a plurality of resistive elements 13c. The number of transistors 11c, the number of resistive elements 12c, and the number of resistive elements 13c included in the switch circuit SW1c are equal to each other.

The transistors 11c are coupled in series between the input terminal RFC and the output terminal RF1. A gate of each transistor 11c is coupled to one terminal of each resistive element 13c. The gate width of each transistor 11c is hereinafter referred to as "Wgc".

Each resistive element 12c is coupled in parallel to each transistor 11c. More specifically, one terminal of each resistive element 12c is coupled to one end of each transistor 11c, and the other terminal thereof is coupled to the other end of each transistor 11c. In the following explanation, the resistance value of each resistive element 12c is referred to as "Rds" that is the same as that of the resistive element 12a.

One terminal of each resistive element 13c is coupled to the gate of each transistor 11c, and the other terminal thereof is coupled to the normal output terminal (+) of the buffer 3. In the following explanation, the resistance value of each resistive element 13c is referred to as "Rggc".

The following is an explanation of the switch circuit SW2c. The switch circuit SW2c includes a plurality of n-type MOSFETs 21c, a plurality of resistive elements 22c, and a plurality of resistive elements 23c. The number of transistors 21c, the number of resistive elements 22c, and the number of resistive elements 23c included in the switch circuit SW2c are equal to each other. For example, the switch circuit SW2c includes the same number of transistors 21c as the number of transistors 11a of the switch circuit SW1a.

The transistors 21c are coupled in series between the input terminal RFC and the output terminal RF2. A gate of each transistor 21c is coupled to one terminal of each resistive element 23c. In the following explanation, the gate width of each transistor 21c is "Wgc" that is the same as that of the transistor 11c.

Each resistive element 22c is coupled in parallel to each transistor 21c. More specifically, one terminal of each resistive element 22c is coupled to one end of each transistor 21c, and the other terminal thereof is coupled to the other end of each transistor 21c. The resistance value of each resistive element 22c is "Rds" that is the same as that of each resistive element 12a.

One terminal of each resistive element 23c is coupled to the gate of each transistor 21c, and the other terminal thereof is coupled to the inverting output terminal (−) of the buffer 3. In the following explanation, the resistance value of each resistive element 23c is "Rggc" that is the same as that of the resistive element 13c.

In the present embodiment, for example, the gate widths Wga, Wgb, and Wgc and the resistance values Rgga, Rggb, and Rggc have the relations "Wga=Wgb=Wgc" and "Rgga<Rggb<Rggc" or "Wga<Wgb<Wgc" and "Rgga=Rggb=Rggc". The gate widths Wga, Wgb, and Wgc and the resistance values Rgga, Rggb, and Rggc may have the relations "Wga<Wgb<Wgc" and "Rgga<Rggb<Rggc". It suffices that the CR time constants have the relation "(CR time constant of the switch circuit SW1a (transistors 11a) and switch circuit SW2a (transistors 21a))<(CR time constant of the switch circuit SW1b (transistors 11b) and switch circuit SW2b (transistors 21b))<(CR time constant of the switch circuit SW1c (transistors 11c) and switch circuit SW2c (transistors 21c))".

In the following explanation, the switch circuit is expressed as "switch circuit SW" in a case where it is not limited to one of the switch circuits SW1a, SW1b, SW1c, SW2a, SW2b, and SW2c.

5.3 Specific Example of Switching Operation

The following is an explanation of a specific example of the switching order in a case of switching the coupling of the input terminal RFC from the output terminal RF1 to the output terminal RF2, with reference to FIG. 18 to FIG. 20. FIG. 18 is a diagram illustrating a switching order in a case where length of rise time Ton is equal to length of fall time Toff in the switching operations. Specifically, FIG. 18 illustrates the case where the operation of turning on the transistors and the operation of turning off the transistors in the switching unit 2 are finished at the same timing. FIG. 19 illustrates a switching order in a case where the length of the rise time Ton is shorter than the length of the fall time Toff in the switching operations. Specifically, FIG. 19 illustrates the case where the operation of turning on the transistors is finished earlier than the operation of turning off the transistors in the switching unit 2. FIG. 20 illustrates a switching order in a case where the length of the rise time Ton is longer than the length of the fall time Toff in the switching operations. Specifically, FIG. 20 illustrates the case where the operation of turning off the transistors is finished earlier than the operation of turning on the transistors in the switching unit 2. In the examples in FIG. 18 to FIG. 20, suppose that the ON resistance Ron of each of the switch circuits SW1a, SW1b, SW1c, SW2a, SW2b, and SW2c is 15Ω. Suppose that a characteristic impedance in a state in which the input terminal RFC is coupled to one of the output terminals RF1 and RF2 is 50Ω. In addition, for example, gate widths Wga, Wgb, and Wgc and the resistance values Rgga, Rggb, and Rggc have the relations "Wga<Wgb<Wgc" and "Rgga=Rggb=Rggc".

First, the following is an explanation of a case where the operation of turning on the transistors and the operation of turning off the transistors in the switching unit 2 are finished at the same timing.

As illustrated in FIG. 18, at Step 0, the input terminal RFC is coupled to the output terminal RF1. For this reason, the switch circuits SW1a, SW1b, and SW1c are set to the ON state, and the switch circuits SW2a, SW2b, and SW2c are set to the OFF state. For example, the RFC impedance is 55Ω.

First, at Step 1, a switching operation in the switching unit 2a is finished. More specifically, the switch circuit SW1a is changed from the ON state to the OFF state. In addition, the switch circuit SW2a is changed from the OFF state to the ON state. As a result, the switch circuits SW1b, SW1c, and SW2a are set to the ON state. In this manner, the input terminal RFC is coupled to the output terminals RF1 and RF2. The RFC impedance is reduced to 30.5Ω.

At Step 2, a switching operation in the switching unit 2b is finished. More specifically, the switch circuit SW1b is changed from the ON state to the OFF state. In addition, the switch circuit SW2b is changed from the OFF state to the ON state. As a result, the switch circuits SW1c, SW2a, and SW2b are set to the ON state. In this manner, the input terminal RFC is coupled to the output terminals RF1 and RF2. The RFC impedance is 30.5Ω.

At Step 3, a switching operation in the switching unit 2c is finished. More specifically, the switch circuit SW1c is changed from the ON state to the OFF state. In addition, the switch circuit SW2c is changed from the OFF state to the ON state. As a result, the switch circuits SW2a, SW2b, and SW2c are set to the ON state. In this manner, the input terminal RFC is coupled to the output terminal RF2. The RFC impedance is 55Ω.

In a case of providing three parallel switching units 2 (SPDT switches), the ON resistance Ron can be set to three times as large as that in the case where the SPDT switch has a one-parallel structure. This structure reduces the gate widths Wga, Wgb, and Wgc in comparison with the gate width Wg in the case where the SPDT switch has a one-parallel structure. This structure can reduce the gate capacitance (CR time constant) of the transistors to approximately ⅓. For this reason, the switching speed (transition time) of the transistors can be shortened to approximately ⅓ in comparison with the case where the SPDT switch has a one-parallel structure.

The following is an explanation of the case where the operation of turning on the transistors is finished earlier than the operation of turning off the transistors in the switching unit 2.

As illustrated in FIG. 19, in the switching units 2a, 2b, and 2c, the timing at which the transistors are changed to the ON state is different from the timing at which the transistors are changed to the OFF state. For this reason, intermediate steps are generated between Step 0 and Step 1, between Step 1 and Step 2, and between Step 2 and Step 3. In the following explanation, the step between Step 0 and Step 1 is referred to as "Step 0.5". The step between Step 1 and Step 2 is referred to as "Step 1.5". The step between Step 2 and Step 3 is referred to as "Step 2.5".

The state at Step 0 is the same as that in FIG. 18.

Thereafter, at Step 0.5, transition of the transistors 21a in the switching unit 2a to the ON state is finished. More specifically, the switch circuit SW1a is maintained at the ON state. The switch circuit SW2a is changed from the OFF state to the ON state. As a result, the switch circuits SW1a, SW1b, SW1c, and SW2a are set to the ON state. In this manner, the input terminal RFC is coupled to the output terminals RF1 and RF2. The RFC impedance is reduced to 30Ω.

At Step 1, transition of the transistors 11a in the switching unit 2a to the OFF state is finished. The states of the switch circuits SW1a, SW1b, SW1c, SW2a, SW2b, and SW2c are the same as those in FIG. 18.

Thereafter, at Step 1.5, transition of the transistors 21b in the switching unit 2b to the ON state is finished. More specifically, the switch circuit SW1b is maintained at the ON state. The switch circuit SW2b is changed from the OFF state to the ON state. As a result, the switch circuits SW1b, SW1c, SW2a, and SW2b are set to the ON state. In this manner, the input terminal RFC is coupled to the output terminals RF1 and RF2. The RFC impedance is reduced to 29Ω.

At Step 2, transition of the transistors 11b in the switching unit 2b to the OFF state is finished. The states of the switch circuits SW1a, SW1b, SW1c, SW2a, SW2b, and SW2c are the same as those in FIG. 18.

Thereafter, at Step 2.5, transition of the transistors 21c in the switching unit 2c to the ON state is finished. More specifically, the switch circuit SW1c is maintained at the ON state. The switch circuit SW2c is changed from the OFF state to the ON state. As a result, the switch circuits SW1c, SW2a, SW2b, and SW2c are set to the ON state. In this manner, the input terminal RFC is coupled to the output terminals RF1 and RF2. The RFC impedance is 30Ω.

At Step 3, transition of the transistors 11c in the switching unit 2c to the OFF state is finished. The states of the switch circuits SW1a, SW1b, SW1c, SW2a, SW2b, and SW2c are the same as those in FIG. 18.

The following is an explanation of the case where the operation of turning off the transistors is finished earlier than the operation of turning on the transistors in the switching unit 2.

As illustrated in FIG. 20, in the switching units 2a, 2b, and 2c, the timing at which the transistors are changed to the ON state is different from the timing at which the transistors are changed to the OFF state. For this reason, intermediate steps are generated between Step 0 and Step 1, between Step 1 and Step 2, and between Step 2 and Step 3.

The state at Step 0 is the same as that in FIG. 18.

Thereafter, at Step 0.5, transition of the transistors 11a in the switching unit 2a to the OFF state is finished. More specifically, the switch circuit SW1a is changed from the ON state to the OFF state. The switch circuit SW2a is maintained at the OFF state. As a result, the switch circuit SW1b and SW1c are set to the ON state. In this manner, the input terminal RFC is coupled to the output terminal RF1. The RFC impedance is increased to 57.5Ω.

At Step 1, transition of the transistors 21b in the switching unit 2a to the ON state is finished. The states of the switch circuits SW1a, SW1b, SW1c, SW2a, SW2b, and SW2c are the same as those in FIG. 18. Thereafter, at Step 1.5, transition of the transistors 11*b* in the switching unit 2*b* to the OFF state is finished. More specifically, the switch circuit SW1*b* is changed from the ON state to the OFF state. The switch circuit SW2*b* is maintained at the OFF state. As a result, the switch circuits SW1*c* and SW2*a* are set to the ON state. In this manner, the input terminal RFC is coupled to the output terminals RF1 and RF2. The RFC impedance is 32.5Ω.

At Step 2, transition of the transistors 21*b* in the switching unit 2*b* to the ON state is finished. The states of the switch circuits SW1*a*, SW1*b*, SW1*c*, SW2*a*, SW2*b*, and SW2*c* are the same as those in FIG. 18.

Thereafter, at Step 2.5, transition of the transistors 11*c* in the switching unit 2*c* to the OFF state is finished. More specifically, the switch circuit SW1*c* is changed from the ON state to the OFF state. The switch circuit SW2*c* is maintained at the OFF state. As a result, the switch circuits SW2*a* and SW2*b* are set to the ON state. In this manner, the input terminal RFC is coupled to the output terminal RF2. The RFC impedance is increased to 57.5Ω.

At Step 3, transition of the transistors 21*c* in the switching unit 2*c* to the ON state is finished. The states of the switch circuits SW1*a*, SW1*b*, SW1*c*, SW2*a*, SW2*b*, and SW2*c* are the same as those in FIG. 18.

For example, when FIG. 18 to FIG. 20 illustrating the specific example of the present embodiment are compared with FIG. 4 to FIG. 6 illustrating the specific example of the first embodiment, increase in the number of switching units 2 (switch circuits SW) coupled in parallel suppresses fluctuations of the RFC impedance in the switching operations and shortens the transition time.

5.4 Advantageous Effect of Present Embodiment

The structure according to the present embodiment produces the same effects as those of the first embodiment.

In addition, with the structure according to the present embodiment, the high frequency semiconductor integrated circuit 1 is enabled to further suppress the impedance fluctuations and improve the switching speed by virtue of increase in the number of switching units 2 arranged in parallel.

6. Sixth Embodiment

A sixth embodiment will be explained hereinafter. The sixth embodiment illustrates a configuration of the high frequency semiconductor integrated circuit 1 different from the fifth embodiment. The following explanation mainly illustrates points different from the fifth embodiment.

6.1 Configuration

The following is an explanation of an example of a whole configuration of the high frequency semiconductor integrated circuit 1 with reference to FIG. 21. FIG. 21 is a block diagram illustrating an example of a whole configuration of the high frequency semiconductor integrated circuit 1.

As illustrated in FIG. 21, the high frequency semiconductor integrated circuit 1 includes switching units 2*a*, 2*b*, and 2*c*, a buffer 3, and delay circuits 6_1, 6_2, 7_1, and 7_2.

The switching units 2*a*, 2*b*, and 2*c* are the same as those in FIG. 16 according to the fifth embodiment.

The buffer 3 includes an input terminal, a normal output terminal (+), and an inverting output terminal (−). The input terminal of the buffer 3 is coupled to an input terminal CTRL. The normal output terminal (+) of the buffer 3 of the present embodiment is coupled to a switch circuit SW1*a* and an input terminal of the delay circuit 6_1. The inverting output terminal (−) of the buffer 3 is coupled to a switch circuit SW2*a* and an input terminal of the delay circuit 6_2.

The delay circuit 6_1 delays the control signal received from the buffer 3 and transmits the control signal to the switch circuit SW1*b* and an input terminal of the delay circuit 7_1. An output terminal of the delay circuit 6_1 is coupled to the switch circuit SW1*b* and an input terminal of the delay circuit 7_1.

The delay circuit 6_2 delays an inverted signal of the control signal received from the buffer 3 and transmits the inverted signal to the switch circuit SW2*b* and an input terminal of the delay circuit 7_2. The delay amount in the delay circuit 6_2 is the same as that in the delay circuit 6_1.

The delay circuit 7_1 further delays the delayed control signal received from the delay circuit 6_1 and transmits the delayed control signal to the switch circuit SW1*c*. Specifically, the delay circuit 7_1 outputs the control signal delayed by the delay circuit 6_1 and the delay circuit 7_1. An output terminal of the delay circuit 7_1 is coupled to the switch circuit SW1*c*.

The delay circuit 7_2 further delays the delayed inverted signal of the control signal received from the delay circuit 6_2 and transmits the delayed inverted signal to the switch circuit SW2*c*. Specifically, the delay circuit 7_2 outputs the inverted signal of the control signal delayed by the delay circuit 6_2 and the delay circuit 7_2. An output terminal of the delay circuit 7_2 is coupled to a switch circuit SW2*c*. The delay amount in the delay circuit 7_2 is the same as that in the delay circuit 7_1. The delay amount in the delay circuits 7_1 and 7_2 may be the same as, or different from, the delay amount in the delay circuits 6_1 and 6_2. The configuration of each of the delay circuits 6_1, 6_2, 7_1, and 7_2 may be the same as, for example, that illustrated in FIG. 14 according to the third embodiment. Instead of the delay circuits 6_1, 6_2, 7_1, and 7_2, resistive elements may be arranged in the same manner as the second embodiment.

In the present embodiment, with the delay circuit 6_1, the switching operation of the switch circuit SW1*b* is delayed with respect to the switch circuit SW1*a*. In addition, with the delay circuit 7_1, the switching operation of the switch circuit SWc is delayed with respect to the switch circuit SW1*b*. In the same manner, with the delay circuit 6_2, the switching operation of the switch circuit SW2*b* is delayed with respect to the switch circuit SW2*a*. In addition, with the delay circuit 7_2, the switching operation of the switch circuit SW2*c* is delayed with respect to the switch circuit SW2*b*.

6.2 Advantageous Effect of Present Embodiment

The structure according to the present embodiment produces the same effects as those of the fifth embodiment.

7. Seventh Embodiment

A seventh embodiment will be explained hereinafter. The seventh embodiment illustrates a configuration of the high frequency semiconductor integrated circuit 1 different from the fifth and the sixth embodiments. The following explanation mainly illustrates points different from the fifth and the sixth embodiments.

7.1 Configuration

The following is an explanation of an example of a whole configuration of the high frequency semiconductor integrated circuit 1 with reference to FIG. 22. FIG. 22 is a block diagram illustrating an example of a whole configuration of the high frequency semiconductor integrated circuit 1.

As illustrated in FIG. 22, the high frequency semiconductor integrated circuit 1 includes switching units 2a, 2b, and 2c, buffers 3a, 3b, and 3c, and delay circuits 8 and 9.

The switching units 2a, 2b, and 2c are the same as those in FIG. 16 according to the fifth embodiment.

The buffer 3a includes an input terminal, a normal output terminal (+), and an inverting output terminal (−). The input terminal of the buffer 3a is coupled to an input terminal CTRL. The normal output terminal (+) of the buffer 3a of the present embodiment is coupled to a switch circuit SW1a. The inverting output terminal (−) of the buffer 3a is coupled to a switch circuit SW2a.

The buffer 3b includes an input terminal, a normal output terminal (+), and an inverting output terminal (−). The input terminal of the buffer 3b is coupled to the input terminal CTRL via the delay circuit 8. The normal output terminal (+) of the buffer 3b of the present embodiment is coupled to a switch circuit SW1b. The inverting output terminal (−) of the buffer 3b is coupled to a switch circuit SW2b.

The buffer 3c includes an input terminal, a normal output terminal (+), and an inverting output terminal (−). The input terminal of the buffer 3c is coupled to the input terminal CTRL via the delay circuits 8 and 9. The normal output terminal (+) of the buffer 3c of the present embodiment is coupled to a switch circuit SWc. The inverting output terminal (−) of the buffer 3c is coupled to a switch circuit SW2c.

The delay circuit 8 delays the control signal received from the input terminal CTRL and transmits the control signal to the buffer 3b and an input terminal of the delay circuit 9. An input terminal of the delay circuit 8 is coupled to the input terminal CTRL. An output terminal of the delay circuit 8 is coupled to an input terminal of the buffer 3b and the input terminal of the delay circuit 9.

The delay circuit 9 further delays the delayed control signal received from the delay circuit 8 and transmits the delayed control signal to the buffer 3c. Specifically, the delay circuit 9 outputs the control signal delayed by the delay circuit 8 and the delay circuit 9. An output terminal of the delay circuit 9 is coupled to an input terminal of the buffer 3c. The delay amount in the delay circuit 8 may be the same as, or different from, the delay amount in the delay circuit 9. The configuration of each of the delay circuits 8 and 9 may be the same as, for example, that illustrated in FIG. 14 according to the third embodiment.

In the present embodiment, with the delay circuit 8, the switching operations of the switch circuits SW1b and SW2b are delayed with respect to the switch circuits SW1a and SW2a. In addition, with the delay circuit 9, the switching operations of the switch circuits SW1c and SW2c are delayed with respect to the switch circuits SW1b and SW2b.

7.2 Advantageous Effect of Present Embodiment

The structure according to the present embodiment produces the same effects as those of the fifth embodiment.

7. Eighth Embodiment

Am eighth embodiment will be explained hereinafter. The eighth embodiment illustrates a case where the high frequency semiconductor integrated circuit 1 is a SP3T switch. A SP3T switch is a high frequency signal changeover switch having an input terminal and three output terminals.

8.1 Configuration

The following is an explanation of an example of a whole configuration of the high frequency semiconductor integrated circuit 1 with reference to FIG. 23. FIG. 23 is a block diagram illustrating an example of a whole configuration of the high frequency semiconductor integrated circuit 1.

As illustrated in FIG. 23, the high frequency semiconductor integrated circuit 1 has a high frequency signal input terminal RFC, a control signal input terminal CTRL, and three output terminals RF1, RF2, and RF3. The high frequency semiconductor integrated circuit 1 electrically couples the input terminal RFC to at least one of the output terminals RF1, RF2 and RF3, based on a control signal input from the input terminal CTRL.

The high frequency semiconductor integrated circuit 1 includes two switching units 2a and 2b, a decoder 101, three delay circuits 111 to 113, and six buffers 121a, 121b, 122a, 122b, 123a, and 123b.

The switching unit 2a according to the present embodiment includes three switch circuits SW1a, SW2a, and SW3a.

The switch circuit SW1a electrically couples the input terminal RFC to the output terminal RF1, based on a control signal CS1 input from a normal output terminal (+) of the buffer 121a. One end of the switch circuit SW1a is coupled to the input terminal RFC, and the other end thereof is coupled to the output terminal RF1.

The switch circuit SW2a electrically couples the input terminal RFC to the output terminal RF2, based on a control signal CS2 input from a normal output terminal (+) of the buffer 122a. One end of the switch circuit SW2a is coupled to the input terminal RFC, and the other end thereof is coupled to the output terminal RF2.

The switch circuit SW3a electrically couples the input terminal RFC to the output terminal RF3, based on a control signal CS3 input from a normal output terminal (+) of the buffer 123a. One end of the switch circuit SW3a is coupled to the input terminal RFC, and the other end thereof is coupled to the output terminal RF3.

The switching unit 2b according to the present embodiment includes three switch circuits SW1b, SW2b, and SW3b.

The switch circuit SW1b electrically couples the input terminal RFC to the output terminal RF1, based on a control signal CS1 input from a normal output terminal (+) of the buffer 121b. One end of the switch circuit SW1b is coupled to the input terminal RFC, and the other end thereof is coupled to the output terminal RF1.

The switch circuit SW2b electrically couples the input terminal RFC to the output terminal RF2, based on a control signal CS2 input from a normal output terminal (+) of the buffer 122b. One end of the switch circuit SW2b is coupled to the input terminal RFC, and the other end thereof is coupled to the output terminal RF2.

The switch circuit SW3b electrically couples the input terminal RFC to the output terminal RF3, based on a control signal CS3 input from a normal output terminal (+) of the buffer 123b. One end of the switch circuit SW3b is coupled to the input terminal RFC, and the other end thereof is coupled to the output terminal RF3.

In the same manner as the first embodiment, the timing of finish of the switching operations in the switching unit 2a is earlier than the timing of finish of the switching operations in the switching unit 2b. Specifically, the timing of finish of the switching operations in the switch circuit SW1a is earlier than the timing of finish of the switching operations in the switch circuit SW1b. The timing of finish of the switching operations in the switch circuit SW2a is earlier than the timing of finish of the switching operations in the switch circuit SW2b. The timing of finish of the switching operations in the switch circuit SW3a is earlier than the timing of finish of the switching operations in the switch circuit SW3b.

The decoder 101 decodes a signal received from the input terminal CTRL and generates control signals CS1, CS2, and CS3. The control signal CS1 is a signal controlling the switch circuits SW1a and SW1b. The control signal CS2 is a signal controlling the switch circuits SW2a and SW2b. The control signal CS3 is a signal controlling the switch circuits SW3a and SW3b. For example, in a case of setting the switch circuits SW1a and SW1b to the ON state, the decoder 101 outputs a control signal CS1 at a level "H". The same is applicable to the control signals CS2 and CS3. The decoder 101 includes three output terminals T1, T2, and T3 outputting the control signals CS1, CS2, and CS3, respectively. The decoder 101 may be provided outside the high frequency semiconductor integrated circuit 1. In this case, the high frequency semiconductor integrated circuit 1 has three signal input terminals to which the control signals CS1 to CS3 are input.

The delay circuit 111 is a circuit delaying the control signal CS1. An input terminal of the delay circuit 111 is coupled to the output terminal T1 of the decoder 101. An output terminal of the delay circuit 111 is coupled to an input terminal of the buffer 121b. The delay circuit 111 transmits the delayed control signal CS1 to the buffer 121b.

The delay circuit 112 is a circuit delaying the control signal CS2. An input terminal of the delay circuit 112 is coupled to the output terminal T2 of the decoder 101. An output terminal of the delay circuit 112 is coupled to an input terminal of the buffer 122b. The delay circuit 112 transmits the delayed control signal CS2 to the buffer 122b.

The delay circuit 113 is a circuit delaying the control signal CS3. An input terminal of the delay circuit 113 is coupled to the output terminal T3 of the decoder 101. An output terminal of the delay circuit 113 is coupled to an input terminal of the buffer 123b. The delay circuit 113 transmits the delayed control signal CS3 to the buffer 123b.

The buffer 121a transmits the control signal CS1 to the switch circuit SW1a. The input terminal of the buffer 121a is coupled to the output terminal T1 of the decoder 101. The normal output terminal (+) of the buffer 121a is coupled to the switch circuit SW1a.

The buffer 121b transmits the delayed control signal CS1 to the switch circuit SW1b. The input terminal of the buffer 121b is coupled to the delay circuit 111. The normal output terminal (+) of the buffer 121b is coupled to the switch circuit SW1b.

The buffer 122a transmits the control signal CS2 to the switch circuit SW2a. The input terminal of the buffer 122a is coupled to the output terminal T2 of the decoder 101. The normal output terminal (+) of the buffer 122a is coupled to the switch circuit SW2a.

The buffer 122b transmits the delayed control signal CS2 to the switch circuit SW2b. The input terminal of the buffer 122b is coupled to the delay circuit 112. The normal output terminal (+) of the buffer 122b is coupled to the switch circuit SW2b.

The buffer 123a transmits the control signal CS3 to the switch circuit SW3a. The input terminal of the buffer 123a is coupled to the output terminal T3 of the decoder 101. The normal output terminal (+) of the buffer 123a is coupled to the switch circuit SW3a.

The buffer 123b transmits the delayed control signal CS3 to the switch circuit SW3b. The input terminal of the buffer 123b is coupled to the delay circuit 113. The normal output terminal (+) of the buffer 123b is coupled to the switch circuit SW3b.

8.2 Advantageous Effect of Present Embodiment

The structure according to the present embodiment produces the same effects as those of the first embodiment.

9. Modifications and the Like

The embodiments are not limited to those explained above, but various modifications are possible.

In the embodiments described above, in a case where the resistance values or the gate widths are the same, they may include errors caused by manufacturing variations.

While certain embodiments have been described, those embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirits of the inventions.

What is claimed is:

1. A high frequency semiconductor integrated circuit comprising:
   a first input terminal receiving a high frequency signal;
   a second input terminal receiving a control signal;
   a first output terminal outputting the high frequency signal;
   a second output terminal outputting the high frequency signal;
   a first switch circuit controlling electrical coupling between the first input terminal and the first output terminal;
   a second switch circuit controlling electrical coupling between the first input terminal and the second output terminal;
   a third switch circuit controlling electrical coupling between the first input terminal and the first output terminal, and coupled in parallel to the first switch circuit; and
   a fourth switch circuit controlling electrical coupling between the first input terminal and the second output terminal, and coupled in parallel to the second switch circuit, wherein
   in a case where a coupling destination of the first input terminal is switched from the first output terminal to the second output terminal, a third switching operation changing the third switch circuit from an ON state to an OFF state and a fourth switching operation changing the fourth switch circuit from the OFF state to the ON state are finished, after a first switching operation changing the first switch circuit from the ON state to the OFF state and a second switching operation changing the second switch circuit from the OFF state to the ON state are finished.

2. The high frequency semiconductor integrated circuit according to claim 1, wherein
- each of the first switching operation for the first switch circuit and the third switching operation for the third switch circuit is executed based on the control signal, and
- each of the second switching operation for the second switch circuit and the fourth switching operation for the fourth switch circuit is executed based on an inverted signal of the control signal.

3. The high frequency semiconductor integrated circuit according to claim 2, further comprising:
- a first buffer including a third input terminal coupled to the second input terminal and receiving the control signal, a third output terminal coupled to the first switch circuit and outputting the control signal, and a fourth output terminal coupled to the second switch circuit and outputting the inverted signal of the control signal;
- a fifth resistive element including one terminal coupled to the third output terminal of the first buffer and the other terminal coupled to the third switch circuit; and
- a sixth resistive element including one terminal coupled to the fourth output terminal of the first buffer and the other terminal coupled to the fourth switch circuit.

4. The high frequency semiconductor integrated circuit according to claim 3, wherein
- the first switch circuit includes a plurality of first transistors coupled in series, and a plurality of first resistive elements each coupled in series to a gate of a respective one of the first transistors,
- the second switch circuit includes a plurality of second transistors coupled in series, and a plurality of second resistive elements each coupled in series to a gate of a respective one of the second transistors,
- the third switch circuit includes a plurality of third transistors coupled in series, and a plurality of third resistive elements each coupled in series to a gate of a respective one of the third transistors,
- the fourth switch circuit includes a plurality of fourth transistors coupled in series, and a plurality of fourth resistive elements each coupled in series to a gate of a respective one of the fourth transistors,
- resistance values of the first resistive elements, the second resistive elements, the third resistive elements, and the fourth resistive elements are equal to each other, and
- gate widths of the first transistors, the second transistors, the third transistors, and the fourth transistors are equal to each other.

5. The high frequency semiconductor integrated circuit according to claim 2, further comprising:
- a second buffer including a fourth input terminal coupled to the second input terminal and receiving the control signal, a fifth output terminal coupled to the first switch circuit and outputting the control signal, and a sixth output terminal coupled to the second switch circuit and outputting the inverted signal of the control signal;
- a first delay circuit coupled to the second input terminal and delaying the control signal; and
- a third buffer including a fifth input terminal coupled to the first delay circuit and receiving the control signal delayed by the first delay circuit, a seventh output terminal coupled to the third switch circuit and outputting the control signal delayed by the first delay circuit, and an eighth output terminal coupled to the fourth switch circuit and outputting the inverted signal of the control signal delayed by the first delay circuit.

6. The high frequency semiconductor integrated circuit according to claim 2, further comprising:
- a fourth buffer including a sixth input terminal coupled to the second input terminal and receiving the control signal, a ninth output terminal coupled to the first switch circuit and outputting the control signal, and a tenth output terminal coupled to the second switch circuit and outputting the inverted signal of the control signal;
- a second delay circuit coupled to the ninth output terminal, delaying the control signal, and transmitting the delayed control signal to the third switch circuit; and
- a third delay circuit coupled to the tenth output terminal, delaying the inverted signal of the control signal, and transmitting the delayed inverted signal of the control signal to the fourth switch circuit.

7. The high frequency semiconductor integrated circuit according to claim 2, further comprising:
- a fifth switch circuit controlling electrical coupling between the first input terminal and the first output terminal, and coupled in parallel to the first switch circuit and the third switch circuit; and
- a sixth switch circuit controlling electrical coupling between the first input terminal and the second output terminal, and coupled in parallel to the second switch circuit and the fourth switch circuit, wherein
- in a case where a coupling destination of the first input terminal is switched from the first output terminal to the second output terminal, a fifth switching operation changing the fifth switch circuit from the ON state to the OFF state and a sixth switching operation changing the sixth switch circuit from the OFF state to the ON state are finished, after the third switching operation and the fourth switching operation are finished.

8. The high frequency semiconductor integrated circuit according to claim 7, wherein
- the fifth switching operation for the fifth switch circuit is executed based on the control signal, and
- the sixth switching operation for the sixth switch circuit is executed based on the inverted signal of the control signal.

9. The high frequency semiconductor integrated circuit according to claim 8, further comprising:
- a fifth buffer including a seventh input terminal coupled to the second input terminal and receiving the control signal, an eleventh output terminal outputting the control signal, and a twelfth output terminal outputting the inverted signal of the control signal;
- a fourth delay circuit coupled to the eleventh input terminal, delaying the control signal, and transmitting the delayed control signal to the third switch circuit;
- a fifth delay circuit coupled to the twelfth input terminal, delaying the inverted signal of the control signal, and transmitting the delayed inverted signal of the control signal to the fourth switch circuit,
- a sixth delay circuit coupled to the fourth delay circuit, further delaying the control signal delayed by the fourth delay circuit, and transmitting the further delayed control signal to the fifth switch circuit, and
- a seventh delay circuit coupled to the fifth delay circuit, further delaying the inverted signal of the control signal delayed by the fifth delay circuit, and transmitting the further delayed inverted signal of the control signal to the sixth switch circuit.

10. The high frequency semiconductor integrated circuit according to claim 8, further comprising:

a sixth buffer transmitting the control signal received from the second input terminal to the first switch circuit, and transmitting the inverted signal of the control signal to the second switch circuit;

an eighth delay circuit coupled to the second input terminal and delaying the control signal;

a seventh buffer coupled to the eighth delay circuit, transmitting the control signal delayed by the eighth delay circuit to the third switch circuit, and transmitting the inverted signal of the control signal delayed by the eighth delay circuit to the fourth switch circuit;

a ninth delay circuit coupled to the eighth delay circuit and further delaying the control signal delayed by the eighth delay circuit; and an eighth buffer coupled to the ninth delay circuit, transmitting the control signal delayed by the eighth delay circuit and the ninth delay circuit to the fifth switch circuit, and transmitting the inverted signal of the control signal delayed by the eighth delay circuit and the ninth delay circuit to the sixth switch circuit.

11. The high frequency semiconductor integrated circuit according to claim 7, wherein switching time of the fifth switching operation for the fifth switch circuit is longer than switching time of the third switching operation for the third switch circuit, and the switching time of the third switching operation for the third switch circuit is longer than switching time of the first switching operation for the first switch circuit, and switching time of the sixth switching operation for the sixth switch circuit is longer than switching time of the fourth switching operation for the fourth switch circuit, and the switching time of the fourth switching operation for the fourth switch circuit is longer than switching time of the second switching operation for the second switch circuit.

12. The high frequency semiconductor integrated circuit according to claim 11, wherein the first switch circuit includes a plurality of first transistors coupled in series, and a plurality of first resistive elements each coupled in series to a gate of a respective one of the first transistors, the second switch circuit includes a plurality of second transistors coupled in series, and a plurality of second resistive elements each coupled in series to a gate of a respective one of the second transistors, the third switch circuit includes a plurality of third transistors coupled in series, and a plurality of third resistive elements each coupled in series to a gate of a respective one of the third transistors, the fourth switch circuit includes a plurality of fourth transistors coupled in series, and a plurality of fourth resistive elements each coupled in series to a gate of a respective one of the fourth transistors, the fifth switch circuit includes a plurality of fifth transistors coupled in series, and a plurality of fifth resistive elements each coupled in series to a gate of a respective one of the fifth transistors, the sixth switch circuit includes a plurality of sixth transistors coupled in series, and a plurality of sixth resistive elements each coupled in series to a gate of a respective one of the sixth transistors, and a resistance value of each of the first resistive elements and the second resistive elements is smaller than a resistance value of each of the third resistive elements and the fourth resistive elements, and the resistance value of each of the third resistive elements and the fourth resistive elements is smaller than a resistance value of each of the fifth resistive elements and the sixth resistive elements.

13. The high frequency semiconductor integrated circuit according to claim 11, wherein the first switch circuit includes a plurality of first transistors coupled in series, and a plurality of first resistive elements each coupled in series to a gate of a respective one of the first transistors, the second switch circuit includes a plurality of second transistors coupled in series, and a plurality of second resistive elements each coupled in series to a gate of a respective one of the second transistors, the third switch circuit includes a plurality of third transistors coupled in series, and a plurality of third resistive elements each coupled in series to a gate of a respective one of the third transistors, the fourth switch circuit includes a plurality of fourth transistors coupled in series, and a plurality of fourth resistive elements each coupled in series to a gate of a respective one of the fourth transistors, the fifth switch circuit includes a plurality of fifth transistors coupled in series, and a plurality of fifth resistive elements each coupled in series to a gate of a respective one of the fifth transistors, the sixth switch circuit includes a plurality of sixth transistors coupled in series, and a plurality of sixth resistive elements each coupled in series to a gate of a respective one of the sixth transistors, and a gate width of each of the first transistors and the second transistors is narrower than a gate width of each of the third transistors and the fourth transistors, and the gate width of each of the third transistors and the fourth transistors is narrower than a gate width of each of the fifth transistors and the sixth transistors.

14. The high frequency semiconductor integrated circuit according to claim 1, wherein switching time of the third switching operation for the third switch circuit is longer than switching time of the first switching operation for the first switch circuit, and switching time of the fourth switching operation for the fourth switch circuit is longer than switching time of the second switching operation for the second switch circuit.

15. The high frequency semiconductor integrated circuit according to claim 14, wherein the first switch circuit includes a plurality of first transistors coupled in series, and a plurality of first resistive elements each coupled in series to a gate of a respective one of the first transistors, the second switch circuit includes a plurality of second transistors coupled in series, and a plurality of second resistive elements each coupled in series to a gate of a respective one of the second transistors, the third switch circuit includes a plurality of third transistors coupled in series, and a plurality of third resistive elements each coupled in series to a gate of a respective one of the third transistors, the fourth switch circuit includes a plurality of fourth transistors coupled in series, and a plurality of fourth resistive elements each coupled in series to a gate of a respective one of the fourth transistors, a gate width of each of the first transistors and the second transistors is narrower than a gate width of each of the third transistors and the fourth transistors.

16. The high frequency semiconductor integrated circuit according to claim 15, wherein resistance values of the first resistive elements, the second resistive elements, the third resistive elements, and the fourth resistive elements are equal to each other.

17. The high frequency semiconductor integrated circuit according to claim 14, wherein
the first switch circuit includes a plurality of first transistors coupled in series, and a plurality of first resistive elements each coupled in series to a gate of a respective one of the first transistors,
the second switch circuit includes a plurality of second transistors coupled in series, and a plurality of second resistive elements each coupled in series to a gate of a respective one of the second transistors,
the third switch circuit includes a plurality of third transistors coupled in series, and a plurality of third resistive elements each coupled in series to a gate of a respective one of the third transistors,
the fourth switch circuit includes a plurality of fourth transistors coupled in series, and a plurality of fourth resistive elements each coupled in series to a gate of a respective one of the fourth transistors,
a resistance value of each of the first resistive elements and the second resistive elements is smaller than a resistance value of each of the third resistive elements and the fourth resistive elements.

18. The high frequency semiconductor integrated circuit according to claim 17, wherein gate widths of the first transistors, the second transistors, the third transistors, and the fourth transistors are equal to each other.

19. The high frequency semiconductor integrated circuit according to claim 1, further comprising:
a thirteenth output terminal outputting the high frequency signal;
a seventh switch circuit controlling electrical coupling between the first input terminal and the thirteenth output terminal;
an eighth switch circuit controlling electrical coupling between the first input terminal and the thirteenth output terminal and coupled in parallel to the seventh switch circuit;
a decoder outputting a first signal controlling the first switch circuit and the third switch circuit, a second signal controlling the second switch circuit and the fourth switch circuit, and a third signal controlling the seventh switch circuit and the eighth switch circuit;
a tenth delay circuit delaying the first signal;
an eleventh delay circuit delaying the second signal;
a twelfth delay circuit delaying the third signal;
a ninth buffer transmitting the first signal received from the decoder to the first switch circuit;
a tenth buffer transmitting the second signal received from the decoder to the second switch circuit;
an eleventh buffer transmitting the third signal received from the decoder to the seventh switch circuit;
a twelfth buffer transmitting the delayed first signal received from the tenth delay circuit to the third switch circuit;
a thirteenth buffer transmitting the delayed second signal received from the eleventh delay circuit to the fourth switch circuit; and
a fourteenth buffer transmitting the delayed third signal received from the twelfth delay circuit to the eighth switch circuit.

* * * * *